United States Patent
Kuroki et al.

(10) Patent No.: US 7,147,989 B2
(45) Date of Patent: *Dec. 12, 2006

(54) PHOTOSENSITIVE COMPOSITION, PLANOGRAPHIC PRINTING PLATE AND PROCESSING METHOD OF PLANOGRAHIC PRINTING PLATE

(75) Inventors: Takaaki Kuroki, Hachioji (JP); Kazuyoshi Suzuki, Hachioji (JP)

(73) Assignee: Konica Minolta Holdings, Inc. (JP)

( * ) Notice: Subject to any disclaimer, the term of this patent is extended or adjusted under 35 U.S.C. 154(b) by 10 days.

This patent is subject to a terminal disclaimer.

(21) Appl. No.: 10/770,365

(22) Filed: Feb. 2, 2004

(65) Prior Publication Data

US 2004/0157154 A1 Aug. 12, 2004

(30) Foreign Application Priority Data

Feb. 10, 2003 (JP) .............................. 2003-032242

(51) Int. Cl.
G03F 7/028 (2006.01)

(52) U.S. Cl. .............................. 430/281.1; 430/273.1; 430/302; 430/309; 430/435; 430/494; 430/945

(58) Field of Classification Search ............. 430/270.1, 430/271.1, 273.1, 275.1, 281.1, 283.1, 284.1, 430/286.1, 287.1, 288.1, 302, 309, 434, 435, 430/494, 945
See application file for complete search history.

(56) References Cited

U.S. PATENT DOCUMENTS 5,049,479 A 9/1991 Zertani et al.

2001/0036598 A1* 11/2001 Shimada et al. ......... 430/281.1
2004/0005515 A1* 1/2004 Hirabayashi ............ 430/273.1
2004/0091816 A1* 5/2004 Matsumura et al. ...... 430/281.1
2004/0191691 A1* 9/2004 Ohta et al. ............... 430/281.1
2004/0219459 A1* 11/2004 Hirabayash ................. 430/300
2004/0234893 A9* 11/2004 Fujimaki .................. 430/283.1
2005/0037286 A1* 2/2005 Hirabayashi et al. .... 430/281.1
2005/0048403 A1* 3/2005 Kuroki ....................... 430/300

FOREIGN PATENT DOCUMENTS

| EP | 1 096 314 A1 | * | 5/2001 |
| EP | 1 213 619 A1 | * | 6/2002 |
| EP | 1 378 793 A2 | | 1/2004 |
| EP | 1 413 925 A2 | * | 4/2004 |
| EP | 1 445 653 | | 8/2004 |
| EP | 04 00 2539 | | 12/2004 |

* cited by examiner

*Primary Examiner*—Barbara L. Gilliam
(74) *Attorney, Agent, or Firm*—Lucas & Mercanti, LLP

(57) ABSTRACT

A photosensitive composition comprising, a polymerizable compound having an ethylenically unsaturated group, a metallic arene compound, and an acid generating agent, wherein, the polymerizable compound is a multifunctional acrylate compound containing an amide bond and a secondary or tertiary amine group in the molecule, and the acid generating agent is a compound containing a trihalomethyl group, a dihalomethyl group or a dihalomethylene group.

16 Claims, No Drawings

PHOTOSENSITIVE COMPOSITION, PLANOGRAPHIC PRINTING PLATE AND PROCESSING METHOD OF PLANOGRAHIC PRINTING PLATE

FILED OF THE INVENTION

The present invention relates to a photosensitive composition, a planographic plate and a processing method thereof, in particular to a photosensitive composition having high sensitivity correlating to laser exposure, as well as high printing durability, and also to a planographic printing plate and a processing method by use thereof, and more particularly to a photosensitive composition which excellent storage stability, desirable safelight safety characteristics, a high margin of safety and much reduced cost, and also to a planographic printing plate and a processing method by use thereof.

BACKGROUND OF THE PRESENT INVENTION

Generally, a planographic printing plate is obtained by imagewise exposure, hardening the exposed portions and dissolving and removing the unexposed areas, and then conducting water-washing followed by a finisher gum treatment. In recent years, a method has been studied in which a planographic printing plate is digitally exposed based on image information employing laser rays, and developed with a developing solution to form images with high resolution and high sharpness. To list as one example, there is a system to manufacture a planographic printing plate by conducting direct scanning exposure onto a sensitized material, employing a light source modulated with image signals transmitted by communication line or outputted signals from an electronic plate making system or an image processing system.

However, a conventional planographic printing plate material employing a diazo resin has exhibited problems in that it was difficult to achieve spectral sensitization or speed enhancement in combination with the oscillating wavelength of laser light used for digital exposure.

Recently, a planographic printing materials used for planographic printing plates, having a photo-polymerizable light-sensitive layer containing a photopolymerization initiator, which can achieve enhanced speed by laser light have been noted for use in digital exposure using laser light. An enhancement of speed to shorten the recording time is desired for CTP (Computer To Plate) printing material in which digital data are recorded using a laser light source. Further, printing plates with improved press life have been desired in various printing fields including newspaper printing and commercial printing such as advertising media.

A photo-polymerizable light sensitive planographic printing plate employing an iron arene compound, triazine and coumarin has been known (for instance, please refer to Patent Document 1). A photo-polymerizable light sensitive planographic printing plate employing an iron arene compound, triazine and ketocoumarin has been also disclosed (for instance, please refer to Patent Document 2). Further, a photo-polymerizable light sensitive planographic printing plate employing a composition containing an iron arene compound and a tertiary amine monomer (for instance, please refer to Patent Document 3), and one employing a composition containing a metallocene, a trihalo compound, a tertiary amine, a dye and a binder (for instance, please refer to Patent Document 4) has been disclosed.

It is well known in the art that an iron arene compound is an effective cationic photopolymerization initiator and also a radical photopolymerization initiator (for instance, please refer to Patent Document 5). Further, it is known that image forming sensitivity is enhanced by using triazine or a sulfonium salt in combination with an iron arene compound as a sensitizer of that (for instance, please refer to Patent Documents 1, 2 and 6).

These combinations are preferable to exhibit a certain effect in terms of enhancing reactivity of a photo polymerization initiator, however these are not yet sufficient from the viewpoint of printing durability of a planographic printing plate.

On the other hand, as a technology to improve printing durability of a planographic printing plate, disclosed are planographic printing plates of the above mentioned Patent Document 5, and those employing a tertiary amine monomer, a PEG acrylate, a dye and a metallocene compound (for instance, please refer to Patent Document 7). These combinations are very effective in the viewpoint of enhancement of printing durability, however as a material correlating to the recent topical violet laser, these have a specific problem of safelight safety characteristics. Further, problems with cost or raw materials and safeness have emerged.

The inventors found as a result of diligent study, that the above problems could be solved by employing an iron arene compound as a photo polymerization initiator in combination with various photo acid generating agents, and thus, accomplished this invention.

Patent Document 1: Registered Japanese Patent No. 1986059 (Claims)
Patent Document 2: Registered Japanese Patent No. 3185585 (Claims)
Patent Document 3: U.S. Pat. No. 5,514,728 (Claims)
Patent Document 4: U.S. Pat. No. 5,049,479 (Claims)
Patent Document 5: International Publication No. 8802879 (Pamphlet)
Patent Document 6: JP-A 2001-100408 (Claims)
Patent Document 7: JP-A 10-306110 (Claims)

SUMMARY OF THE INVENTION

The object of the present invention is to provide a photosensitive composition exhibiting highly improved characteristics such as high sensitivity correlating to laser exposure, high printing durability, and further, improved storage stability, enhanced safelight safety characteristics, a high margin of safety and reduced cost, and to provide a planographic printing plate and a method by use thereof.

The above object of the present invention is achieved by the following.

1. A photosensitive composition comprising:
   (a) a polymerizable compound having an ethylenically unsaturated group;
   (b) a metallic arene compound; and
   (c) an acid generating agent,
   wherein, the polymerizable compound is a multifunctional acrylate compound containing an amide bond and a secondary or a tertiary amine group in the molecule, and
   the acid generating agent is a compound containing a trihalomethyl group, a dihalomethyl group or a dihalomethylene group in the molecule.

2. The photosensitive composition according to item 1 above, wherein the acid generating agent is a compound represented by Formulas (1) or (2):

$$CR^2{}_xH_{3-x}-(C=O)-R^1 \qquad \text{Formula (1)}$$

wherein x is an integer of 2 or 3, $R^1$ is an aryl group, an acyl group or an organic heterocyclic group, and $R^2$ is a chlorine atom or a bromine atom, $$CR^2_xH_{3-x}-R^3 \quad \text{Formula (2)}$$

wherein x is an integer of 2 or 3, $R^3$ is an aryl group, an acyl group or an organic heterocyclic group other than a triazine group, and $R^2$ is a chlorine atom or a bromine atom.

3. The photosensitive composition according to item 1 above, wherein the acid generating agent possesses an oxadiazole group.

4. The photosensitive composition according to item 2 above, wherein the acid generating agent possesses an oxadiazole group.

5. The photosensitive composition according to item 1 above, wherein the acid generating agent is a compound represented by Formulas (3) or (4), $$R^4-C(Y)_2-(C=O)-R^5 \quad \text{Formula (3)}$$

wherein $R^4$ is a hydrogen atom, a halogen atom, an alkyl group, an aryl group, an acyl group, an alkylsulfonyl group, an arylsulfonyl group or a cyano group, $R^5$ is a monovalent subsituent group, provided that $R^4$ and $R^5$ may combine to form a ring, and Y is a halogen atom, $$C(Y)_3-(C=O)-X-R^6 \quad \text{Formula (4)}$$

wherein $R^6$ is a monovalent substituent group, X is O or $-NR^7-$, $R^7$ is a hydrogen atom or an alkyl group, provided that $R^6$ and $R^7$ may combine to form a ring, and Y is a halogen atom.

6. The photosensitive composition according to item 2 above, wherein the acid generating agent is a compound represented by Formulas (3) or (4), $$R^4-C(Y)_2-(C=O)-R^5 \quad \text{Formula (3)}$$

wherein $R^4$ is a hydrogen atom, a halogen atom, an alkyl group, an aryl group, an acyl group, an alkylsulfonyl group, an arylsulfonyl group or a cyano group, $R^5$ is an monovalent subsituent group, provided that $R^4$ and $R^5$ may combine to form a ring, and Y is a halogen atom, $$C(Y)_3-(C=O)-X-R^6 \quad \text{Formula (4)}$$

wherein $R^6$ is a monovalent substituent group, X is O or $-NR^7-$, $R^7$ is a hydrogen atom or an alkyl group, provided that $R^6$ and $R^7$ may combine to form a ring, and Y is a halogen atom.

7. The photosensitive composition according to any one of items 1–6 above, wherein the halogen atom of the acid generating agent is a chlorine atom or a bromine atom.

8. The photosensitive composition according to any one of items 1–7 above, wherein 10–90 weight % of the polymerizable compound has a weight average molecular weight of 15,000–500,000 and an acid value of 30–200 mg/KOH.

9. The photopolymerizable compound according to item 8 above, wherein a ratio of units having a reactive group is 5–50 mol % based on the total mole of the polymerizable compound.

10. The photosensitive composition according to items 1–9 above, wherein the compound having an ethylenically unsaturated group contains a multifunctional acrylate compound containing an amide bond and a secondary or a tertiary amine group in the molecule.

11. The photosensitive composition according to items 1–10 above, wherein the photosensitive composition further contains at least one dye selected from the group consisting of a coumarin, ketocoumarin, oxonol, barbituric acid, pyrromethane borate, diphenylmethane, xanthene dye, coumarin derivatives, and thiobarbituric acid skeltone.

12. A planographic printing plate comprising a support having thereon the following layers in the stated order:
(a) a layer containing the photosensitive composition described in any one of items 1–10; and
(b) an oxygen gas shielding layer;
wherein the support is a metallic support and a surface of the support is electrically roughened (or electrically grained) in an acid medium, and then subjected to an anodization treatment to provide a surface Ra of 0.2 to 0.7 µm.

13. The planographic printing plate according to item 12 above, wherein the surface Ra of the support is 0.5 to 0.7 µm.

14. The planographic printing plate according to item 13 above, wherein the surface of the support is further treated with polyvinylphosphonic acid to provide hydrophilicity.

15. A processing method of the planographic printing plate described in any one of items 13–14 above comprising the steps of:
(a) exposing the planographic printing plate to a laser light source; and
(b) forming an image employing an alkaline development processing,
wherein processing is conducted with a developing solution of a pH of 10.0–12.5.

16. The processing method according to item 15 above, wherein the alkaline developing solution contains an inorganic alkaline agent and a nonionic surface active agent having a polyoxyalkylene ether group, and a specific electric conductivity of the alkaline developing solution is 3–30 mS/cm.

17. The processing method according to item 15 above, wherein the alkaline developing solution contains an inorganic alkaline agent and an anionic surface active agent having a polyoxyalkylene ether group, and a specific electric conductivity of the alkaline developing solution is 3–30 mS/cm.

DESCRIPTION OF THE PREFERRED EMBODIMENTS

The present invention will further be detailed. The present invention can provide a photosensitive composition exhibiting remarkably enhanced printing durability and very good safelight safety characteristics at a moderate price employing a photo polymerization initiator in combination with:

(1) a multifunctional acrylate containing an amide bond and a secondary or tertiary amine group in the molecule;

(2) 10–90 weight % of the compound, having an ethylenically unsaturated bond, has an weight average molecular weight of 15,000–500,000 and an acid value of 30–200 mg/KOH; and (3) the content of units having a reactive group contained in repeating units of the binder is 5–50% based on the total weight of the polymerizable compound.

The photo polymerization initiator composition of this invention contains at least one polyhalogenated compound chosen from the foregoing compounds represented by foregoing Formulas (1) and (2).

The compounds preferably usable in this invention represented by Formula (1) will be detailed. $R^2$ is a chlorine atom or a bromine atom, but a chlorine atom is more preferable, and a trihalo compound is preferable than a dihalo compound from the standpoint of sensitivity and printing resistance.

Further, examples of the organic groups containing the heterocyclic structure, represented by $R^1$, include a nitrogen containing ring, an oxygen containing ring, a sulfur containing ring, a phosphor containing ring, an arsenic containing ring, a selenium containing ring, a tellurium containing ring, a boron containing ring and a silicon containing ring. Of these, preferred are a nitrogen containing ring, an oxygen containing ring and a sulfur containing ring, and specifically preferred is a nitrogen containing ring.

As these nitrogen containing ring compounds, any of a monocyclic or condensed ring compound may be preferably employed. Examples of monocyclic rings include ethyleneimine, trimethyleneimine, caprolactam, pyrrole, imidazole, pyrazole, thiazole, oxazole, triazole, tetrazole, piperidine, pyridin, pyrazine, pyrimidine, pyridazine, morpholine, thiomorpholine, and triazine.

Examples of condensed rings include pyrrolidine, pyrinedine, indolizine, (iso)indole, indasole, purine, quinolidine, (iso)quinoline, naphthylidine, phthalazine, quinoxaline, quinazoline, cinnoline, pteridine, lumazin, carbazole, carboline, acridine, phenazine, phenanthridine, phenantroline, perimidine, anthrazine, and phenoxazine.

Formula (1) is preferably combined with the foregoing heterocycle as described in the following Formula (1-1), with which enhancement of sensitivity and printing durability becomes significantly apparent.

Formula (1-1)

Z—C—C—CR²₃ (with N in ring)

wherein $R^2$ is a chlorine atom or a bromine atom, Z is a atomic group completing a nitrogen containing heterocyclic ring.

Specific examples of Formula (1) include the following compounds of CL 1–CL 22.

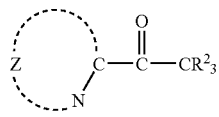
CL1

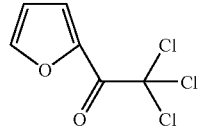
CL2

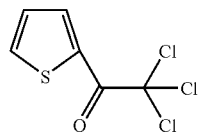
CL3

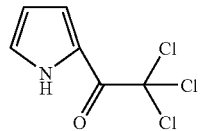
CL4

-continued

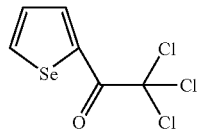
CL5

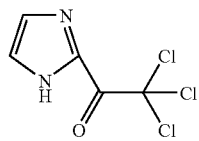
CL6

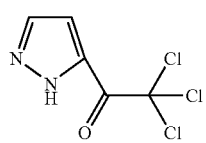
CL7

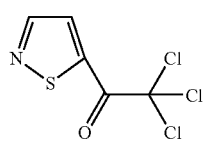
CL8

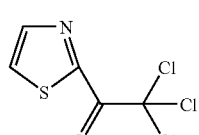
CL9

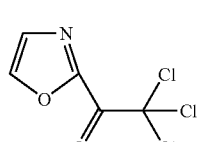
CL10

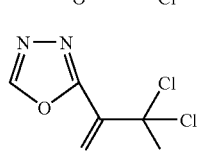
CL11

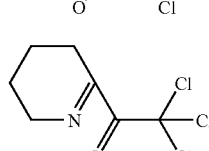
CL12

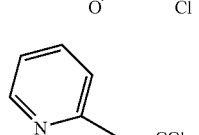
CL13

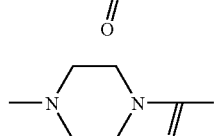
CL14

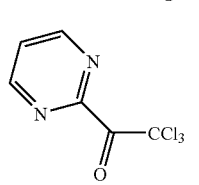
CL15

-continued

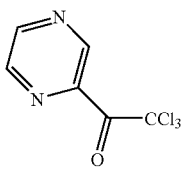
CL16

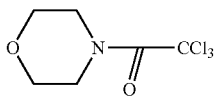
CL17

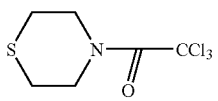
CL18

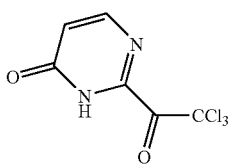
CL19

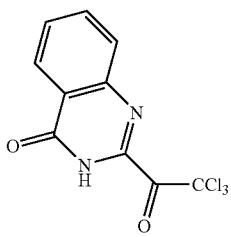
CL20

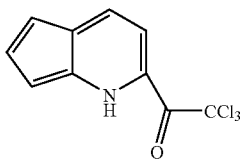
CL21

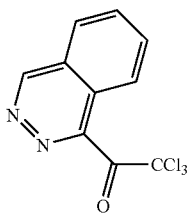
CL22

The compounds preferably usable in this invention represented by Formula (2) will be detailed. $R^2$ is a chlorine atom or a bromine atom, but a chlorine atom is more preferable, and a trihalo compound is preferable than a dihalo compound from the standpoint of sensitivity and printing resistance.

Further, specific examples of the organic groups containing the heterocyclic structure include a nitrogen containing ring, an oxygen containing ring, a sulfur containing ring, a phosphor containing ring, an arsenic containing ring, a selenium containing ring, a tellurium containing ring, a boron containing ring and a silicon containing ring. Of these, preferred are a nitrogen containing ring, an oxygen containing ring and a sulfur containing ring, and specifically preferred is a nitrogen containing ring.

As these nitrogen containing ring compounds, any of a monocyclic or heterocyclic compound may be preferably employed. Examples of monocyclic rings include ethyleneimine, trimethyleneimine, caprolactam, pyrrole, imidazole, pyrazole, thiazole, oxazole, triazole, tetrazole, piperidine, pyridin, pyrazine, pyrimidine, pyridazine, morpholine, thiomorpholine, and triazine.

Examples of condensed rings include pyrrolidine, pyrinedine, indolizine, (iso)indole, indasole, purine, quinolidine, (iso)quinoline, naphthylidine, phthalazine, quinoxaline, quinazoline, cinnoline, pteridine, lumazin, carbazole, carboline, acridine, phenazine, phenanthridine, phenantroline, perimidine, anthrazine, and phenoxazine.

Formula (2) is preferably combined with the foregoing heterocycle as described in the following Formula (2-1), with which enhancement of sensitivity and printing durability becomes significantly apparent.

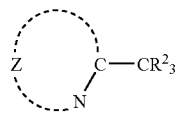

Formula (2-1)

wherein $R^2$ is a chlorine atom or a bromine atom, Z is a atomic group completing a nitrogen containing heterocyclic ring.

Specific examples of Formula (2) include the following compounds of CL 23–CL 44.

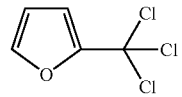
CL23

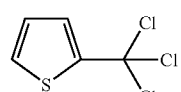
CL24

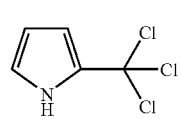
CL25

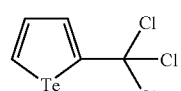
CL26

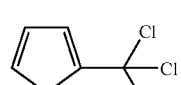
CL27

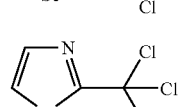
CL28

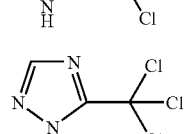
CL29

-continued

CL30 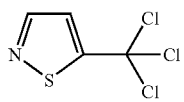

CL31 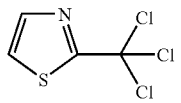

CL32 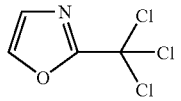

CL33 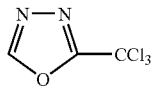

CL34 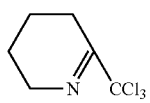

CL35 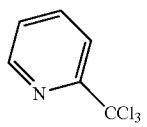

CL36 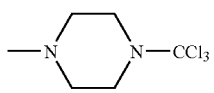

CL37 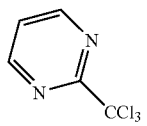

CL38 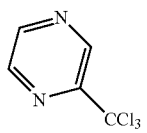

CL39 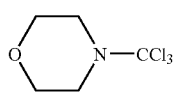

CL40 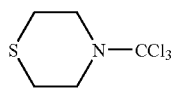

CL41 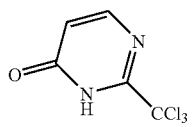

CL42 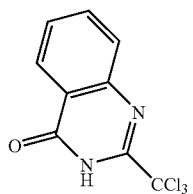

-continued

CL43 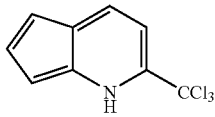

CL44 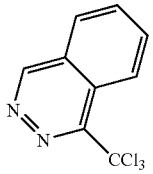

Br 1 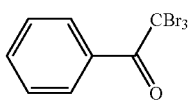

Br 2 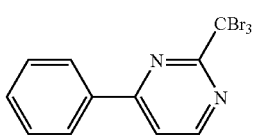

Further, as photo polymerization initiators preferably employed in combination with the polyhalogenated compounds, listed are titanocene compounds, monoalkyltriaryl borate compounds and iron arene complex compounds.

As titanocene compounds, listed are compounds described in JP-A Nos. 63-41483 and 2-291. Further, preferable examples include bis(pentadienyl)-Ti-di-chloride, bis (cyclopentadienyl)-Ti-bis-phenyl, bis(cyclopentadienyl)-Ti-bis-2,3,4,5,6-pentafluorophenyl, bis(cyclopentadienyl)-Ti-bis-2,3,5,6-tetrafluorophenyl, bis(cyclopentadienyl)-Ti-bis-2,4,6-trifluorophenyl, bis(cyclopentadienyl)-Ti-bis-2,6-difluorophenyl, bis(cyclopentadienyl)-Ti-bis-2,4-difluorophenyl, bis(methylcyclopentadienyl)-Ti-bis-2,3,4,5,6-pentafluorophenyl, bis(methylcyclopentadienyl)-Ti-bis-2,3,5,6-tetrafluorophenyl, bis(methylcyclopentadienyl)-Ti-bis-2,6-difluorophenyl (IRUGACURE 727L, produced by Ciba Specialty Chemicals), bis(cyclopentadienyl)-bis[2,4,6-trifluoro-3-(pyri-1-yl)phenyl]titanium, and bis(cyclopentadienyl)-bis[2,4,6-trifluoro-3-(2-5-dimethylpyri-1-yl)phenyl] titanium.

As monoalkyltriaryl borate compounds, listed may be compounds described in JP-A Nos. 62-150242 and 62-143044. Further preferable examples include tetra-n-butyl ammonium.n-butyl-trinaphthalene-1-yl-borate, tetra-n-butyl ammonium.n-butyl-triphenyl-borate, tetra-n-butyl ammonium.n-butyl-tri-(4-tert-butylphenyl)-borate, tetra-n-butyl ammonium.n-hexyl-tri-(3-chloro-4-methylphenyl)-borate, and tetra-n-butyl ammonium.n-hexyl-tri-(3-fluorophenyl)-borate.

Metallic arene compounds usable in this invention can be represented by following Formula (5).

Formula (5)

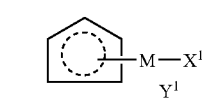

wherein $X^1$ is a group containing at least one benzene ring, $Y^1$ is a basic ionic compound such as $BF_4^-$, $PF_6^-$, $AsF_6^-$ and $SbF_6^-$, M is a metal such as iron, nickel or cobalt.

Examples of preferable metallic arene compounds include an iron arene compound, a chromium arene compound, a manganese arene compound, a cobalt arene compound and a nickel arene compound. Of these, the iron arene compound is preferable to obtain enhanced photosensitivity.

As iron arene compounds, listed are compounds described in JP-A 59-219307. More preferable examples include η-benzene-(η-cyclopentadienyl)iron.hexafluorophosphate, η-cumene-(η-cyclopentadienyl)iron-hexafluorophosphate, η-fluorene-(η-cyclopentadienyl)iron-hexafluorophosphate, η-naphthalene-(η-cyclopentadienyl)iron-hexafluorophosphate, η-xylene-(η-cyclopentadienyl)iron-hexafluorophosphate, and η-benzene-(η-cyclopentadienyl)iron.tetrafluoroborate. The added amount of these compounds is commonly 0.01–20 weight %, preferably 0.03–15 wt %, and specifically preferably 0.05–10 wt %.

In this invention, further added to the above mentioned photo polymerization initiators, photo polymerization initiators within the public domain up to now such as titanocene compounds and monoalkyltriaryl borate compounds which are described below may be employed in combination without any specific limitations.

As titanocene compounds, listed are compounds described in JP-A Nos. 63-41483 and 2-291. Further, preferable examples include bis(pentadienyl)-Ti-di-chloride, bis(cyclopentadienyl)-Ti-bis-phenyl, bis(cyclopentadienyl)-Ti-bis-2,3,4,5,6-pentafluorophenyl, bis(cyclopentadienyl)-Ti-bis-2,3,5,6-tetrafluorophenyl, bis(cyclopentadienyl)-Ti-bis-2,4,6-trifluorophenyl, bis(cyclopentadienyl)-Ti-bis-2,6-difluorophenyl, bis(cyclopentadienyl)-Ti-bis-2,4-difluorophenyl, bis(methylcyclopentadienyl)-Ti-bis-2,3,4,5,6-pentafluorophenyl, bis(methylcyclopentadienyl)-Ti-bis-2,3,5,6-tetrafluorophenyl, bis(methylcyclopentadienyl)-Ti-bis-2,6-difluorophenyl (IRUGACURE 727L, produced by Ciba Specialty Chemicals), bis(cyclopentadienyl)-bis[2,4,6-trifluoro-3-(pyri-1-yl)phenyl]titanium, and bis(cyclopentadienyl)-bis[2,4,6-trifluoro-3-(2-5-dimethylpyri-1-yl)phenyl] titanium.

As monoalkyltriaryl borate compounds, listed may be compounds described in JP-A Nos. 62-150242 and 62-143044. Further preferable examples include tetra-n-butyl ammonium.n-butyl-trinaphthalene-1-yl-borate, tetra-n-butyl ammonium.n-butyl-triphenyl-borate, tetra-n-butyl ammonium.n-butyl-tri-(4-tert-butylphenyl)-borate, tetra-n-butyl ammonium.n-hexyl-tri-(3-chloro-4-methylphenyl)-borate, and tetra-n-butyl ammonium.n-hexyl-tri-(3-fluorophenyl)-borate.

Furthermore, listed are carbonyl compounds, organic sulfur compounds, persulfides, redox compounds, azo and diazo compounds, and photoreducing dyes described in, for example, "Light Sensitive Systems", section 5, J. Kosar. Specific examples are disclosed in British Patent No. 1,459, 563. Specifically, the following compounds may be employed as photo polymerization initiators usable in combination with the afore-mentioned photo polymerization initiators relating to this invention.

Also listed, for example, may be benzoin derivatives such as benzoin methyl ether, benzoin-i-propyl ether, α,α-dimethoxy-α-phenylacetophenone; benzophenone derivatives such as benzophenone, 2,4-dichlorobenzophenone, methyl o-benzoylbenzoate, and 4,4'-bis(dimethylamino) benzophenone; thioxanthone derivatives such as 2-chlorothioxanthone, and 2-i-propylthioxanthone; anthraquinone derivatives such as 2-chloroanthraquinone and 2-methylanthraquinone; acridone derivatives such as N-methylacridone, and N-butylacridone; α-diethoxyacetophenone, benzyl, fluorenone, xanthone and uranyl compounds; triazine derivatives described in JP-B Nos. 59-1281 and 61-9621 (hereinafter, the term, JP-B refers to examined Japanese Patent Publication) and JP-A 60-60104; organic peroxide compounds described in JP-A Nos. 59-1504 and 61-243807; diazonium compounds described in JP-B Nos. 43-23684, 44-6413, 47-1604, and U.S. Pat. No. 3,567,453; organic azide compounds described in U.S. Pat. Nos. 2,848,328, 2,852,379 and 2,940,853; o-quinonediazides described in JP-B Nos. 36-22062, 37-13109, 38-18015, and 45-9610; various kinds of onium compounds described in JP-B 55-39162, JP-A 59-14023 and Macromolexuls, vol. 10, pg. 1307 (1977); azo compounds described in JP-A 59-142205; metal arene complexes described in JP-A 1-54440, European Patent Nos. 109,851 and 126,712, and J. Imag. Sci., vol. 30, pg. 174 (1986); (oxo)sulfonium organic boron complexes described in Japanese Patent Application Nos. 4-56831 and 4-89535; transition metal complexes containing a transition metal such as ruthenium, described in Coordination Chemistry Review, vol. 84, pp. 85–277 (1988), and JP-A 2-182701; 2,4,5-triarylimidazole dimers described in JP-A 3-209477; and organic halogen compounds such as carbon tetrabromide, described in JP-A 59-107344.

To increase sensitivity, an acid generating agent is incorporated as an essential component in this invention. An acid generating agent in this invention is a compound containing a trihalomethyl group, a dihalomethyl group or a dihalomethylene group. This kind of compound is public knowledge in the art. A trihalomethyl group may combine with an aromatic carbocyclic nucleus or a heterocyclic nucleus, directly or through a conjugated double bond or through a series of conjugated double bonds. Preferable compounds contain a triazine nucleus as a basic structure, to which two trihalomethyl groups preferably combine, as described in, for example, European Patent Nos. A137,452 and A563,925.

Further, preferably listed are compounds represented by foregoing Formulas (1) or (2), compounds containing an oxadiazole group, or compounds represented by foregoing Formulas (3) or (4).

These compounds absorb light well in the 300–500 nm ultraviolet/visible spectral regions. However, suitable are compounds containing a trihalomethyl group, which only slightly absorb light or do not at all absorb spectral radiation to form images. For example, suitable is trihalomethyltriazine containing a (saturated) aliphatic substituent group or an unsaturated substituent group in which the mesomerismable (or resonancible) π-electron area has a relatively short range. Compounds which contain other basic structure and absorb short wavelength light in the ultraviolet region, such as phenyltrihalomethylsulfon, specifically phenyltribromomethylsulfon, and phenyltrihalomethyl ketone, are, in principle, also suitable. Generally, an amount of these halomethyl compounds is 0.01–20-weight % based on the total weight of photo polymerizable, nonvolatile components in the composition of this invention, are preferably 0.03–15 weight %, and more preferably 0.05–10 weight %.

Further, a halomethyloxadiazole compound may be employed as an acid generating agent in this invention. As a halomethyloxadiazole compound, employed may be any compound which contains a halomethyl group and an oxadiazole group, and forms an active radical. Compounds represented by following Formulas (6) or (7) are preferred as halomethyl oxadiazole compounds.

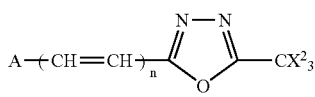

Formula (6)

wherein $X^2$ is a chlorine atom or a bromine atom, A is an aryl group or a heterocyclic group, both of which may be substituted, and n is an integer of 0, 1 or 2.

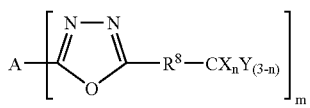

Formula (7)

wherein $R^8$ is a single bond or a divalent bond group selected from an alkylene group, an oxyalkylene group, an ether group, a carbonyl group, an ester group, an amide group or a sulfonamide group which may have a substituent group; X is a chlorine atom or a bromine atom; Y is a hydrogen atom or an alkyl group having 1–8 carbon atoms, which may have a substituent group; n is 2 or 3; m is an integer of more than 2; and A is an m-valent organic group.

An aryl group is a phenyl group or a naphthyl group. A heterocyclic group is a 5–7-membered ring, and the heterocyclic group may form a condensed ring. A substituent group is a hydroxyl group, an alkyl group having 1–6 carbon atoms, an alkoxy group having 1–6 carbon atoms, or a vinyl group which may be substituted. Specific examples of the foregoing oxadiazole compounds are listed below.

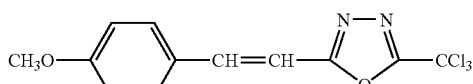

6-1

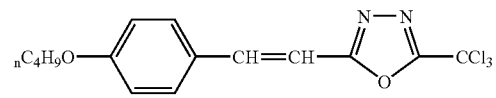

6-2

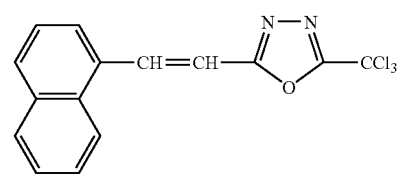

6-3

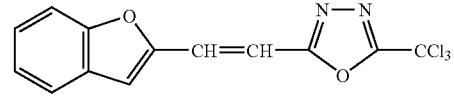

6-4

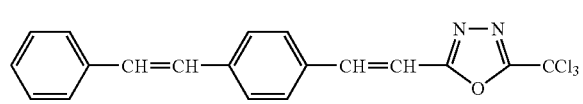

6-5

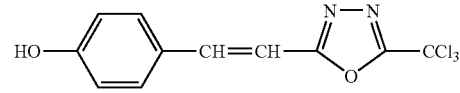

6-6

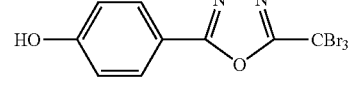

7-1

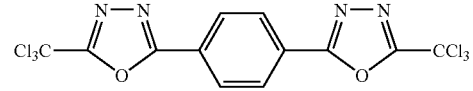

7-2

An acid generating agent of this invention is preferably a compound selected from the compounds represented by foregoing Formula (3). Further, the compound is more preferably a compound represented by foregoing Formula (4).

Specific examples of compounds represented by Formula (4) include the following compound, namely of BR2–BR47. The examples represented by Formula (3) are BR1 and BR48–BR66. The compounds of which halogen atoms of bromine atoms are replaced with chlorine atoms can be preferably employed in this invention.

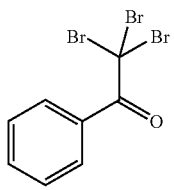

BR1

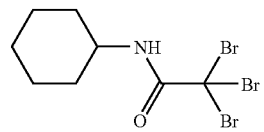

BR2

-continued
| | |
|---|---|
| BR3 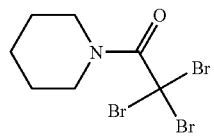 | BR4 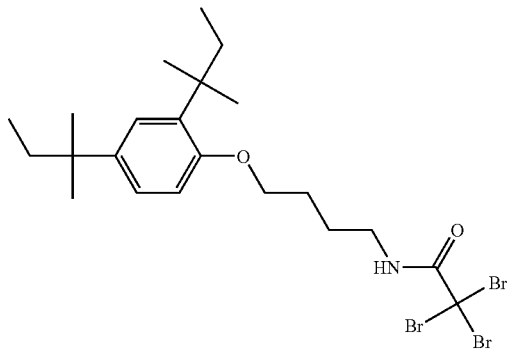 |
| BR5 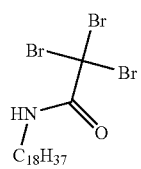 | BR6 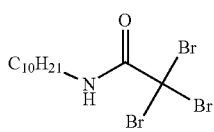 |
| BR7 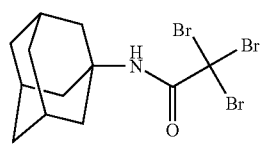 | BR8 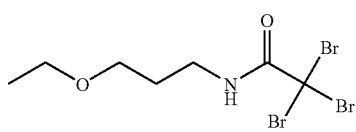 |
| BR9 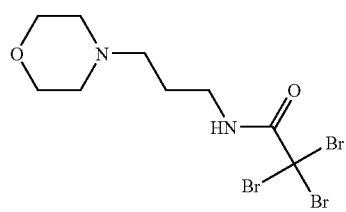 | BR10 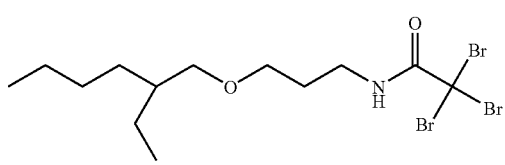 |
| BR11 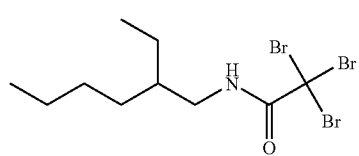 | BR12 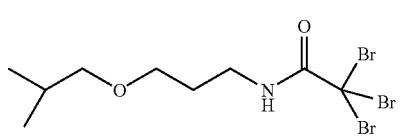 |
| BR13 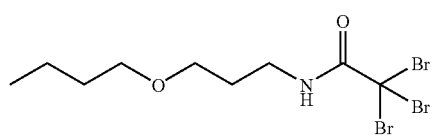 | BR14 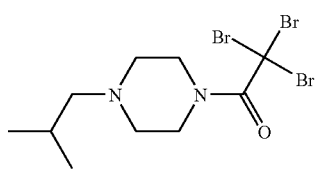 |
| BR15 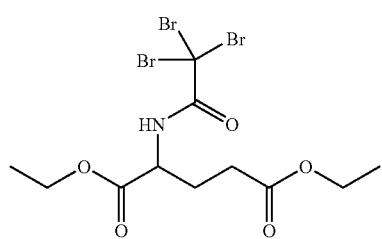 | BR16 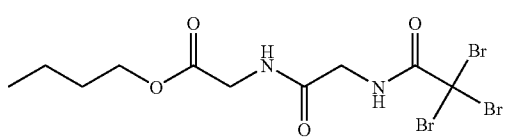 |

-continued
BR17 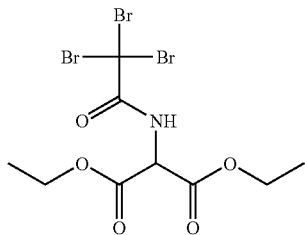 BR18 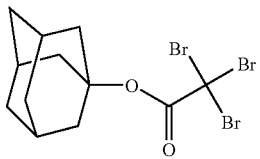
BR19 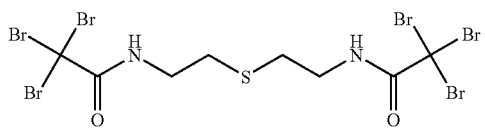 BR20 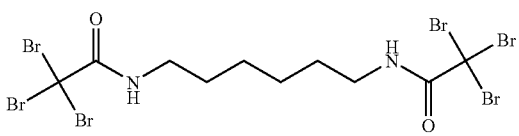
BR21 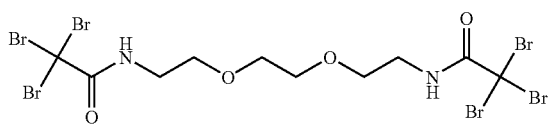 BR22 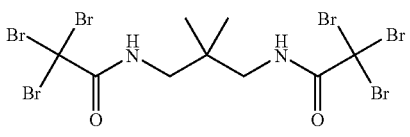
BR23 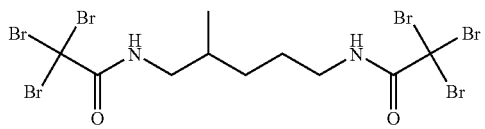 BR24 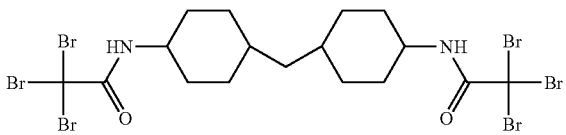
BR25 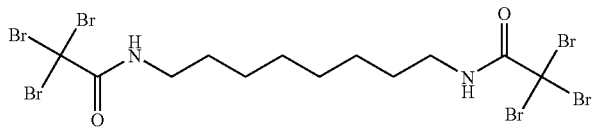
BR26 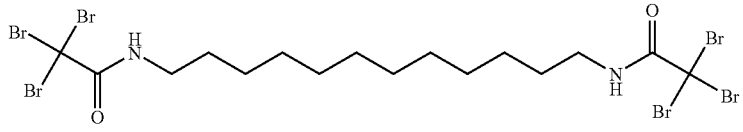
BR27 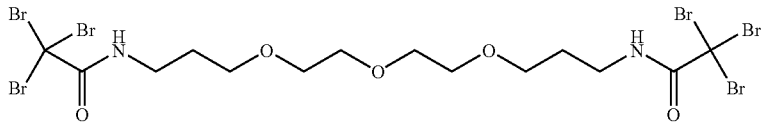
BR28 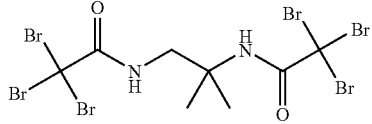 BR29 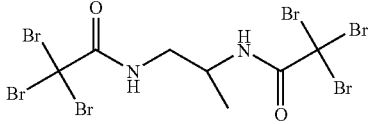
BR30 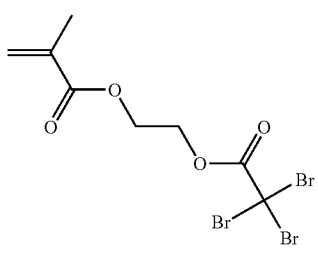 BR31 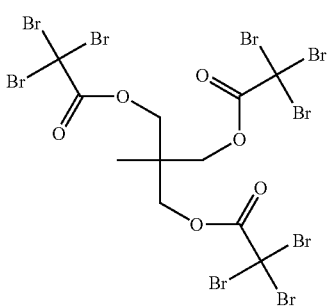

-continued
BR32
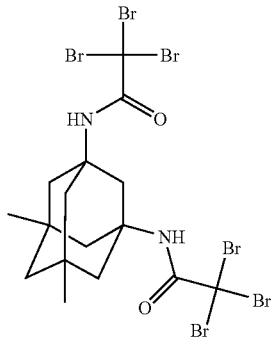
BR33
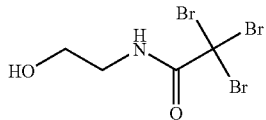
BR34
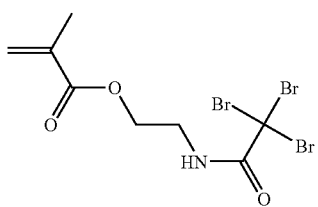
BR35
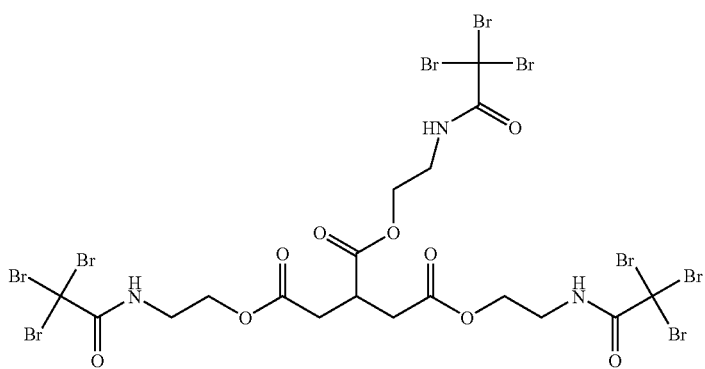
BR36
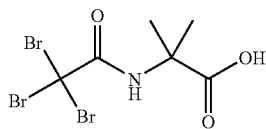
BR37
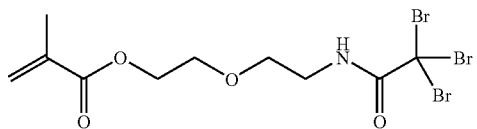
BR38
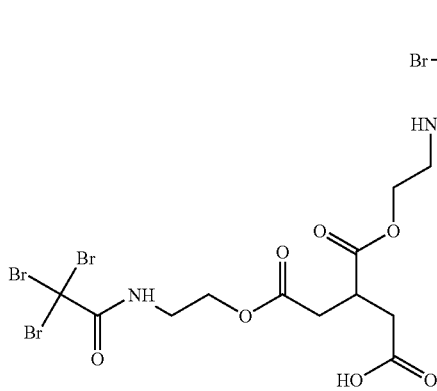
BR39
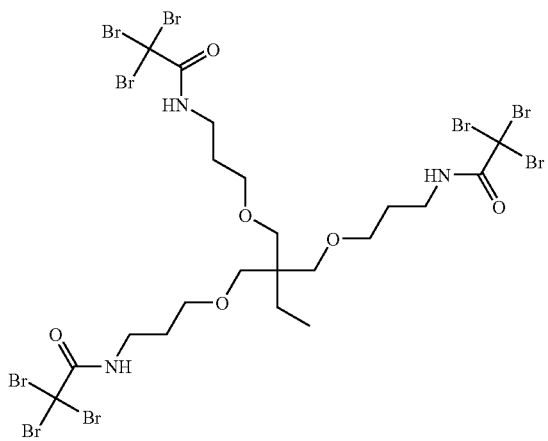

-continued
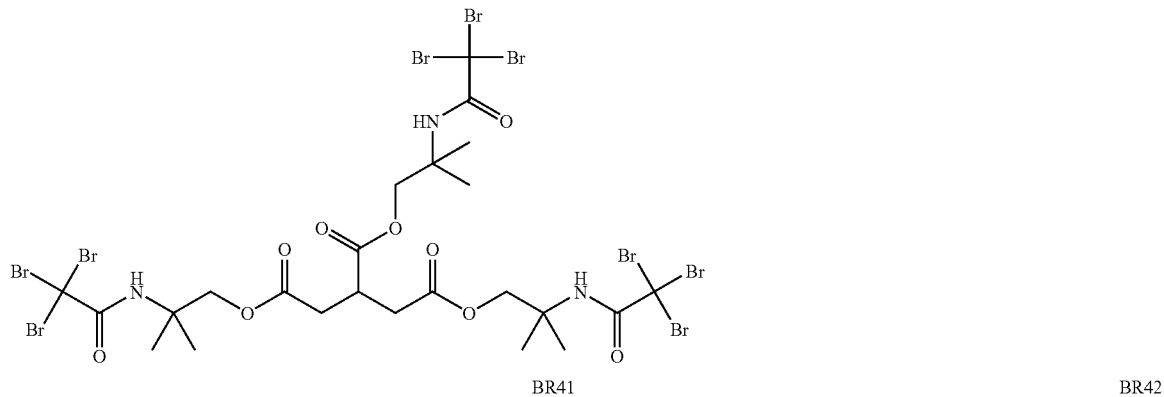
BR40
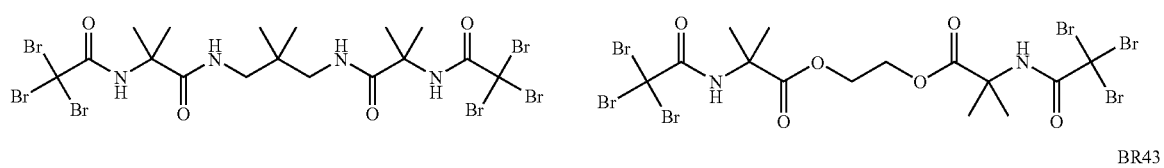
BR41  BR42
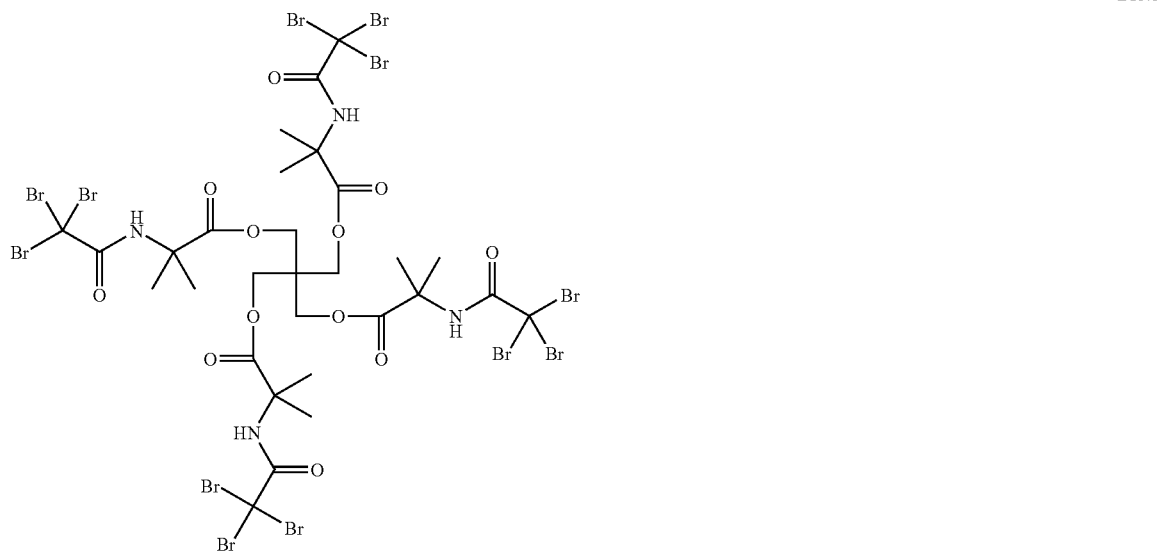
BR43
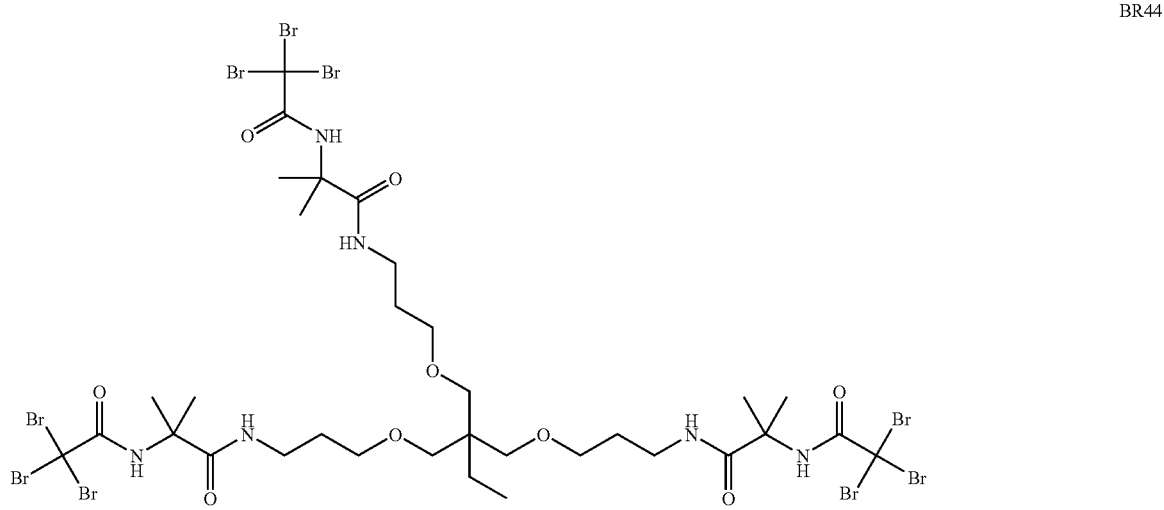
BR44

-continued
BR45 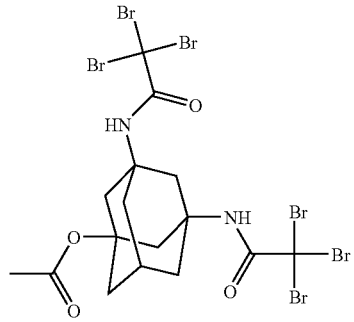
BR46 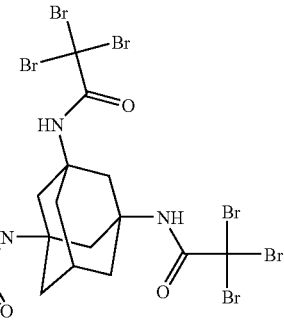
BR47 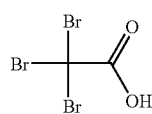
BR48 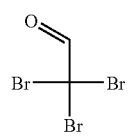
BR49 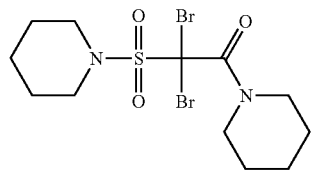
BR50 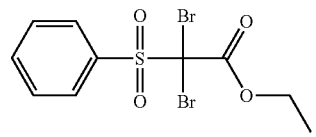
BR51 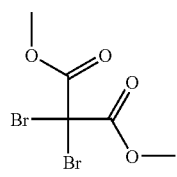
BR52 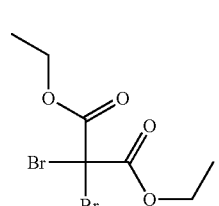
BR53 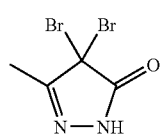
BR54 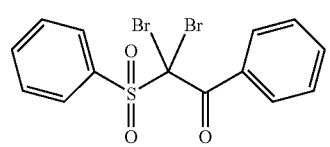
BR55 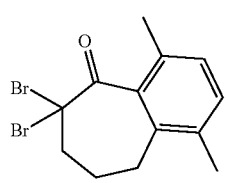
BR56 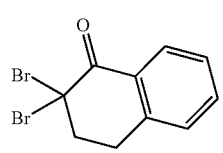
BR57 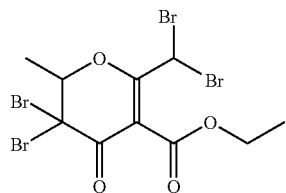
BR58 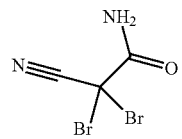
BR59 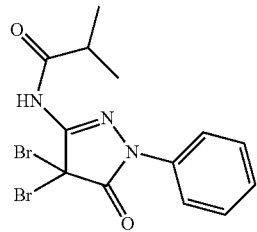
BR60 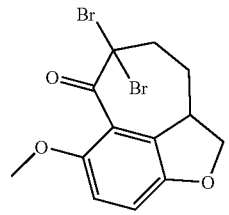

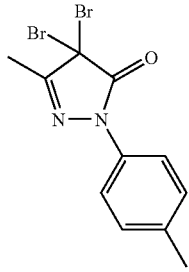

BR61

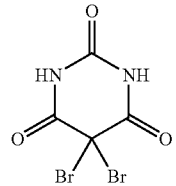

BR62

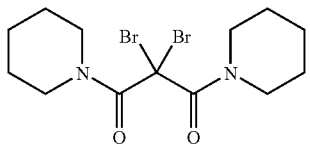

BR63

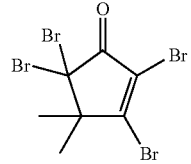

BR64

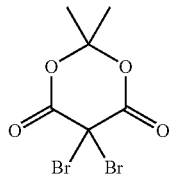

BR65

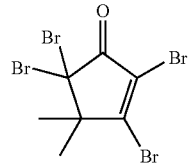

BR66

As a polymerizable compound having an ethylenically unsaturated group of this invention, employed may be generally known radical-polymerizable monomers, polyfuctional monomers and poly-functional oligomers all of which contain plural addition-polymerizable ethylenical double bonds, as used in UV-hardenable resin. Such monomer compounds and oligomers are not specifically limited and preferred examples thereof include monofunctional acrylic acid esters such as 2-ethylhexyl acrylate, 2-hydroxypropyl acrylate, glycerol acrylate, tetrahydrofurfuryl acrylate, phenoxyethyl acrylate, nonylphenoxyethyl acrylate, tetrahydrofurfuryloxyethtl acrylate, tetrahydrofurfuryloxyhexanolide acrylate, an acrylate of ε-caprolactone adduct with 1,3-dioxane alcohol, and 1,3-dioxolan acrylate, and methacrylic acid, itaconic acid, crotonic acid and maleic acid esters, in which the foregoing acrylates are replaced by methacrylate, itaconate, crotonate or maleate; bi-functional acrylic aid esters such as ethylene glycol diacrylate, triethylene glycol diacrylate, pentaerythritol diacrylate, hydroquinone diacrylate, resorcin diacrylate, hexanediol diacrylate, neopentyl glycol diacrylate, tripropylene glycol diacrylate, hydroxypivaric acid neopentyl glycol diacrylate, neopentyl glycol adipate diacrylate, hydroxypivaric acid neopentyl glycol ε-caprolactone adduct diacrylate, 2-(2-hydroxy-1,1-dimethylethyl)-5-hydroxymethyl-5-ethyl-1,3-dioxane diacrylate, tricyclodecanedimethylol diacrylate, tricycloecanedimethylol diacrylate ε-caplactone adduct, and 1,6-hexanediol diglycidyl ether diacrylate, and methacrylic acid, itaconic acid, crotonic acid and maleic acid esters, in which the foregoing acrylates are replaced by methacrylate, itaconate, crotonate or maleate; polyfunctional acrylic acid esters such as trimethylolpropane triacrylate, ditrimethylolpropane tetraacrylate, trimethylolethane triacrylate, pentaerythritol triacrylate, pentaerythritol teraacrylate, dipentaerythritol tetraacrylate, dipentaerythritol pentaacrylate, dipentaerythritol hexaacrylate, dipentaerythritol hexaacrylate ε-caprolactone adduct, pyrogallol triacrylate, propionic acid.dipentaerythritol triarylate, propionic acid.dipentaerythritol tetraacrylate, and hydroxypivalylaldehyse modified dimethylolpropane triacetate, and also methacrylic acid, itaconic acid, crotonic acid and maleic acid esters, in which the foregoing acrylates are replaced by methacrylate, itaconate, crotonate or maleate.

Pre-polymers are also usable similarly to the foregoing. The pre-polymers include, for example, compounds to be described later. Pre-polymers are also usable, in which acrylic acid or methacrylic acid is introduced into an oligomer having an appropriate molecular weight, thereby rendering it photopolymerizable. These pre-polymers can be used alone or in combination with more than two kinds, and may also be used in combination with the foregoing monomers and/or oligomers.

Example of the pre-polymers include polyester acrylates in which acrylic acid is introduced into polyesters obtained by the combination of polybasic acids such as adipic acid, trimellitic acid, maleic acid, phthalic acid, terephthalic acid, hymic acid, malonic acid, succininc acid, glutaric acid, itaconic acid, pyromellitic acid, fumaric acid, pimelic acid, sebacic acid, docecanoic acid, and tetrahydrophthalic acid, and polyhydric alcohols such as ethylene glycol, propylene glycol, diethylene glycol, propylene oxide, 1,4-butanediol, triethylene glycol, tetraethylene glycol, polyethylene glycol, glycerin, trimethylolpropane, pentaerythritol, sorbitol, 1,6-hexanediol and 1,2,6-hexanetriol; epoxyacrylates, in which (meta)acrylic acid is introduced into epoxy resin, such as bisphenol A.epichlorohydrin.(meta)acrylic acid and phenol novolac.epichlorohydrin.(meta)acrylic acid; urethane acrylates, in which (meta)acrylic acid is introduced into urethane resin, such as ethylene glycol.adipic acid.tolylenediisocyanate.2-hydroxyethylacrylate, polyethylene glycol.tolylenediisocyanate.2-hydroxyethylacrylate, hydroxyethylphthalyl methacrylate.xylenediisocyanate, 1,2-polybutadiene glycol.tolylenediisocyanate.2-hydroxyethylacrylate, and trimethylolpropane.propylene glycol.tolylenediisocyanate.2-hydroxyethylacrylate; silicone resin acrylates, such as polysiloxane acrylate, and polysiloxane.diisocyanate.2-ydroxyethyl acrylate; alkyd modified acrylates, in which a (metha)acrylic group is introduced into oil-modified alkyd resin; and spirane resin acrylates.

The photosensitive composition relating to this invention can also contain monomers such as a phosphazene monomer, triethylene glycol, isocyanuric acid EO (ethylene oxide) modified diacrylate, isocyanuric acid EO (ethylene oxide) modified triacrylate, dimethyloltricyclodecane diacrylate, trimethylolpropane acrylic acid benzoic acid ester, alkylene glycol type acrylic acid modification, and urethane modified acrylate; and addition-polymerizable oligomer or pre-polymer having a constitutional repeating unit formed of the above monomers.

In this invention, ethylenic monomers usable in combination include a phosphoric acid ester compound containing at least a (metha)acryloyl group. Such a compound, in which at least a part of the hydroxyl groups of phosphoric acid is esterified, is not specifically limited as long as an acryloyl group is incorporated.

In addition to the compounds described above, usable are compounds described in JP-A Nos. 58-212994, 61-664962-46688, 62-48589, 62-173295, 62-187092, 63-67189, and 1-244891; compounds described in "Chemical Goods of 11290", pp. 286–294 (Kagaku-kogyo Nipposha); and compounds described in "UV/Ev Hardening Handbook (Raw Material)", pp. 11–65 (Kobunshi Kankokai). Of the foregoing compounds, compounds containing at least two acryl or methacryl groups within the group are preferred, and further, those having a molecular weight of 15,000–500,000 are more preferred.

Regarding an acid value, it is preferable to be in the range of 30–200 mg/KOH, but more preferable 50–150 mg/KOH.

In this invention, a polymerizable compound having an ethylenically unsaturated group is a multifunctional acrylate compound which contains an amide bond and a secondary or tertiary amine group in the molecule. The structure of such compounds is not specifically limited, however, those in which a hydroxy-containing tertiary amine compound is modified with glycidyl methacrylate, methacrylic acid chloride or acrylic acid chloride are preferably used. Specific examples thereof include polymerizable compounds described in JP-A Nos. 1-165613, 1-203413 and 1-197213.

In this invention, preferably used is a reaction product of a polyhydric alcohol containing a tertiary amino group in the molecule, a diisocyanate compound and a compound containing a hydroxyl group and an addition-polymerizable ethylenically double bond.

Examples of the expression "a polyhydric alcohol containing a tertiary amino group in the molecule" (hereinafter, also denoted as tertiary amino-containing alcohol) include triethanolamine, N-polyhydric methyldiethanolamine, N-ethyldiethanolamine, N-n-butyldiethanolamine, N-tert-butyldiethanolamine, N,N-di(hydroxyethyl)aniline, N,N,N', N'-tetra-2-hydroxypropylethylenediamine, p-tolyldiethanolamine, N,N,N',N'-tetra-2-hydroxyethylethlenediamine, N,N-bis(2-hydroxypropyl)aniline, allyldiethanolamine, 3-(dimethylamino)-1,2-propanediol, 3-diethylamino-1,2-propane diol, N,N-di(n-propyl)amino-2,3-propane diol, N,N-di(iso-propyl)amino-2,3-propane diol, and 3-(N-methyl-N-benzylamino)-1,2-propane diol, but are not limited to the foregoing.

Examples of the diisocyanate compound include butane-1,4-diisocyanate, hexane-1,6-diisocyanate, 2-methylpentane-1,5-diisocyanate, octane-1,8-diisocyanate, 1,3-diisocyanatomethyl-cyclohexane, 2,2,4-trimethylhexane-1,6-diisocyanate, isophoronediisocyanate, 1,2-phenylenediisocyanate, 1,2-phenylenediisocyanate, 1,4-phenylenediisocyanate, tolylene-2,4-diisocyanate, tolylene-2,5-diisocyanate, tolylene-2,6-diisocyanate, 1,3-di(isocyanatomethyl)benzene, 1,3-bis(1-isocyanato-1-methylethyl)benzene, but are not limited to the foregoing. Examples of the compound containing a hydroxyl group and an addition-polymerizable ethylenically double bond include compounds MH-1 through MH-13, as shown below, but are not limited to these.

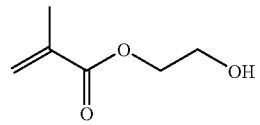

MH-1

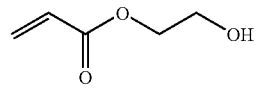

MH-2

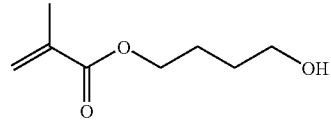

MH-3

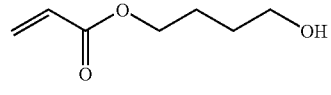

MH-4

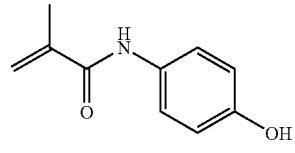

MH-5

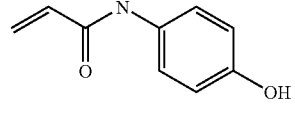

MH-6

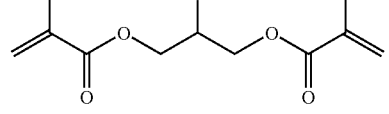

MH-7

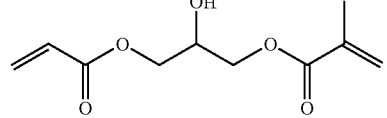

MH-8

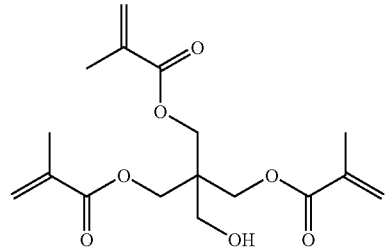

MH-9

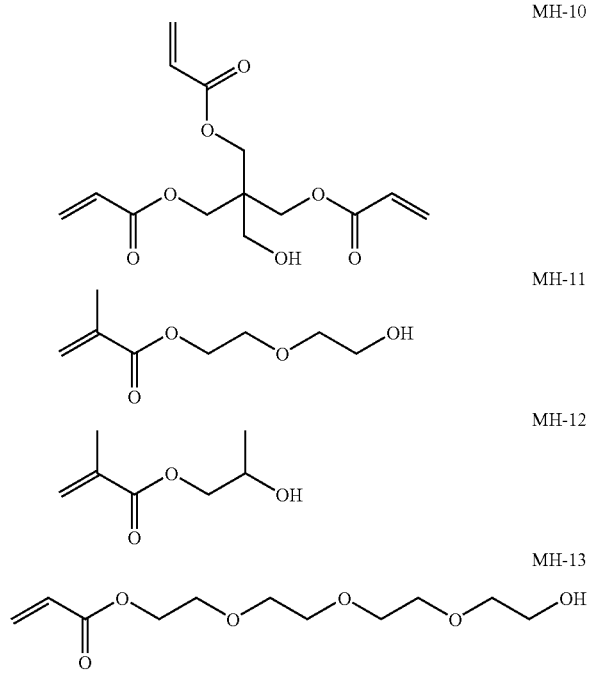

Of the foregoing compounds, 2-hydroxyethylmethacrylate, 2-hydroxyethylacrylate, 4-hydroxybutylacrylate, 2-hydroxypropylene-1,3-dimethacrylate, and 2-hydroxypropylene-1-methacrylate-3-acrylate are preferred.

The reaction can be conducted in a manner similar to the method for synthesizing a urethane acrylate through the ordinary reaction of diol compounds, diisocyanate compounds and hydroxy-containing acrylate compounds.

Specific examples of the reaction product of a tertiary amino group-containing polyhydric alcohol, a diisocyanate compound and a compound containing a hydroxyl group and an addition-polymerizable ethylenically double bond are shown below.

M-1: a reaction product of triethanolamine (1 mol), hexane-1,6-diisocyanate (3 mol) and 2-hydroxyethyl methacrylate (3 mol);

M-2: a reaction product of triethanolamine (1 mol), isophoronediisocyanate (3 mol) and 2-hydroxyethyl acrylate (3 mol);

M-3: a reaction product of N-n-butyldiethanolamine (1 mol), 1,3-bis(1-isocyanato-1-methylethyl)benzene (2 mol) and 2-hydroxypropylene-1-methacrylate-3-acrylate (2 mol);

M-4: a reaction product of N-n-butyldiethanolamine (1 mol), 1,3-di(isocyanatomethy)benzene (2 mol) and 2-hydroxypropylene-1-methacrylate-3-acrylate (2 mol);

M-5: a reaction product of N-methyldiethanolamine (1 mol), tolylene-2,4-diisocyanate (2-mol) and 2-hydroxypropylene-1,3-dimethacrylate (2 mol).

Further, also usable are acrylates and alkylacrylates described in JP-A Nos. 1-105238 and 2-127404. The added amount of these compounds is commonly 0.01–80 weight %, preferably 1–70 wt %, and specifically preferably 5–60 wt %.

In the planographic printing plate of this invention, polymeric binder materials are preferably included. Polymeric binder materials usable in this invention include, for example, acrylic polymer, polyvinyl butyral resin, polyurethane resin, polyamide resin, polyester resin, epoxy resin, phenol resin, polycarbonate resin, polyvinyl butyral resin, polyvinyl formal resin, shellac and other natural resins. These resins may be used in combination thereof.

Of the polymer binders described above, a vinyl copolymer obtained by copolymerization of acryl type monomers is preferred, and a copolymer composed of (a) carboxyl-containing monomer and (b) methacrylic acid alkyl ester or acrylic acid alkyl ester is more preferred.

Preferred examples of the carboxyl-containing monomer include α,β-unsaturated carboxylic acids such as acrylic acid, methacrylic acid, maleic acid, maleic acid anhydride, itaconic acid, and itaconic acid anhydride. A carboxylic acid such as a half ester of phthalic acid and 2-hydroxymethacrylate is also preferred.

Specific examples of a methacrylic acid alkyl ester and acrylic acid alkyl ester include unsubstituted alkyl esters, such as methyl methacrylate, ethyl methacrylate, propyl methacrylate, butyl methacrylate, amyl methacrylate, hexyl methacrylate, heptyl methacrylate, octyl methacrylate, nonyl methacrylate, decyl methacrylate, undecyl methacrylate, dodecyl methacrylate, methyl acrylate, ethyl acrylate, propyl acrylate, butyl acrylate, amyl acrylate, hexyl acrylate, heptyl acrylate, octyl acrylate, nonyl acrylate, decyl acrylate, undecyl acrylate, and dodecyl acrylate; cyclic alkyl ester such as cyclohexyl methacrylate and cyclohexyl acrylate; substituted alkyl esters, such as benzyl methacrylate, 2-chloroethyl methacrylate, N,N-dimethylaminoethyl methacrylate, and glycidyl acrylate, benzyl acrylate, 2-chloroethyl acrylate, N,N-dimethylaminoethyl acrylate, and glycidyl acrylate.

In the polymer binders used in this invention, the following monomers (1)–(14) are usable as a copolymerizable monomer:

(1) monomers containing an aromatic hydroxyl group, e.g., o-(or p- or m-)hydroxystyrene, and o-(or p- or m-)hydroxyphenylacrylate;

(2) monomers containing an aliphatic hydroxyl group, e.g., 2-hydroxyethyl acrylate, 2-hydroxyethyl methacrylate, N-methylol acrylamide, N-methylol methacrylamide, 4-hydroxybutyl methacrylate, 5-hydroxypentyl acrylate, 5-hydroxypentyl methacrylate, 6-hydroxyhexyl acrylate, 6-hydroxyhexyl methacrylate, N-(2-hydroxyethyl)acrylamide, N-(2-hydroxyethyl)methacryamide and hydroxyethyl vinyl ether;

(3) monomers containing an aminosulfonyl group, e.g., m-(or p-)aminosulfonylphenyl methacrylate, m-(or p-) aminosulfonylphenyl acrylate, N-(p-aminosulfonylphenyl)-methacrylamide, and N-(p-aminosulfonylphenyl)acrylamide;

(4) monomers containing a sulfonamido group, e.g., N-(p-toluenesulfonyl)acrylamide, and N-(p-toluenesulfonyl)methacrylamide;

(5) acrylamides or methacrylamides, e.g., acrylamide, methacrylamide, N-ethylacrylamide, N-hexylacrylamide, N-cyclohexylacrylamide, N-phenylacrylamide, N-(4-nitrophenyl)acrylamide, N-ethyl-N-phenylacrylamide, N-(4-hydroxyphenyl)acrylamide, and N-(4-hydroxyphenyl)methacrylamide;

(6) monomers containing a fluoroalkyl group, e.g., trifluoroethyl acrylate, trifluoroethyl methacrylate, tetrafluoropropyl methacrylate, hexafluoropropyl methacrylate, octafluoropentyl acrylate, octafluoropentyl methacrylate, heptadefluorodecyl methacrylate, and N-butyl-N-(2-acryloxyethyl)heptadecafluorooctylsulfonamide;

(7) vinyl ethers, e.g., ethyl vinyl ether, 2-chloroethyl vinyl ether, propyl vinyl ether, butyl vinyl ether, octyl vinyl ether, and phenyl vinyl ether;

(8) vinyl esters, e.g., vinyl acetate, vinyl chloroacetate, vinyl butylate, and vinyl benzoate;

(9) styrenes, e.g., styrene, methylstyrene, and chloromethylstyrene;

(10) vinyl ketones, e.g., methyl vinyl ketone, ethyl vinyl ketone, propyl vinyl ketone, and phenyl vinyl ketone;

(11) olefins, e.g., ethylene, propylene, i-butylene, butadiene, and isoprene;

(12) N-vinylpyrrolidone, N-vinylcarbazol, and 4-vinylpyridine;

(13) monomers containing a cyano group, e.g., acrylonitrile, methacrylonitrile, 2-pentenenitrile, 2-methyl-3-butenenitrile, 2-cyanoethyl acrylate, and o-(or m- or p-) cyanostyrene; and

(14) monomers containing an amino group, e.g., N,N-diethylaminoethyl methacrylate, N,N-diethylaminoethyl acrylate, N,N-dimethylaminoethyl methacrylate, polybutadiene urethane acrylate, N,N-dimethylaminopropyl acrylamide, N,N-dimethyl acrylamide, acryloyl morpholine, N-i-propyl acrylamide, and N,N-diethyl acrylamide.

Monomers other than the monomers described above may be caused to co-polymerize with the monomers described above. Further, an unsaturated bond-containing vinyl copolymer, which can be obtained by causing a compound incorporating a (metha)acryloyl group and an epoxy group in the molecule to be reacted through addition reaction with a carboxyl group contained in the vinyl copolymer described above, is also preferable as a polymer binder usable in this invention. An unsaturated bond-containing vinyl copolymer obtained by reaction of the hydroxyl group contained in the vinyl copolymer above and the compound containing an isocyanate group and a (metha)cryloylgroup is also preferable.

Specific examples of the compound containing both a (metha)acryloyl group and an epoxy group in the molecule include glycidyl acrylate, glycidyl methacrylate, and unsaturated compounds containing an epoxy group as described in JP-A No. 11-271969.

The foregoing copolymer preferably has a weight average molecular weight of 10,000 to 200,000, which can be determined by gel permeation chromatography (GPC), but the weight average molecular weight is not specifically limited to the foregoing range.

The content of a macro molecule polymer in the photosensitive composition is preferably in the range of 10–90 weight %, more preferably 15–70, and specifically preferably in the range of 20–50, in terms of sensitivity.

A polymer contained in the polymer binder preferably exhibits an acid value of 10–250 mg/KOH, more preferably 30–200, and specifically preferably 50–150, resulting in balanced polarity throughout all the photosensitive layers and thereby inhibiting coagulation of pigments contained in the photosensitive layer coating composition.

In cases when laser light is used as a light source, spectral sensitizing dyes are preferably incorporated in the photosensitive layer. It is preferred to use dyes having an absorption maximum in the vicinity of the wavelengths of the light source.

Examples of compounds capable of causing spectral sensitization in the range of the visible to near-infrared region include a cyanine, phthalocyanine, merocyanine, porphyrin, spiro compounds, ferrocene, fluorene, fulgide, imidazole, perylene, phenazine, phenothiazine, polyene, azo compounds, diphenylmethane, triphenylmethane, polymethineacryzine, coumalin, coumalin derivatives, keto-coumalin, quinacridon, indigo, styryl, pyrylium compounds, pyrromethene compounds, pyrazolotriazole compounds, benzothiazole compounds, barbituric acid derivatives, thiobarbituric acid compounds and keto-alcohol borate complexes, and compounds described in European Patent No. 568,993, U.S. Pat. Nos. 4,508,811 and 5,227,227, and JP-A Nos. 2001-125255 and 11-271969. Prefered are coumarin, keto-coumarin, oxonol, barbituric acid, pyrromethene borate, and dyes having a diphenylmethane structure. More preferred are coumarin, coumarin derivatives, keto-coumarin, a xanthene dye, barbituric acid derivatives, and thiobarbituric acid derivatives, and still more preferred are coumarin, coumarin derivatives and a xanthene dye. The added amount of these compounds is commonly 0.01–20 weight %, preferably 0.03–15 wt %, and specifically preferably 0.05–10 wt %.

Supports relating to this invention have a hydrophilic surface. For example, hydrophilic surface-exhibiting metal plates such as aluminum, stainless steel, chromium or nickel, and metal foil-laminated or metal foil-evaporated plastic film such as polyester film, polyethylene film, polystyrene film or polypropylene film can be used as a support relating to this invention. Also usable are polyester film, polyvinyl chloride film and nylon film, the surface of which has been treated to enhance hydrophilicity. Of these, an aluminum support is preferred, including pure aluminum and aluminum alloys.

Varieties of aluminum alloys are usable, for example, alloys of aluminum and metals such as silicon, copper, manganese, magnesium, chromium, zinc, lead, bismuth, nickel, titanium, sodium and iron.

It is preferred that prior to surface-roughening (graining treatment), the support is subjected to a degreasing treatment to remove roll oil from the surface. Employed can be a degreasing treatment using a solvent such as trichlene or a thinner, and also a degreasing treatment using emulsion of kerosene or triethanol. Aqueous alkali solutions, e.g., aqueous caustic soda may also be used for the degreasing treatment. Stains or oxide film which cannot be removed only by the degreasing treatment described above can be removed by using an aqueous alkali solution, e.g., aqueous caustic soda. The use of an aqueous alkali solution, such as aqueous caustic soda results in formation of smuts on the surface of the support so that the treated support is preferably subjected to a desmutting treatment by immersion into an acid such as phosphoric acid, nitric acid, sulfuric acid or chromic acid, or mixtures thereof. Surface roughening can be conducted, for example, by a mechanical method or an electrolytic etching method.

The mechanical surface roughening usable in this invention is not specifically limited and brush rubbing or honing polishing is preferred. Surface roughening by brush rubbing can be carried out in such a manner that a rotary brush using brush bristles of 0.2 to 0.8 mm in diameter is rotated, while pressing the brush against the surface of the support and supplying thereto a slurry of 10 to 100 µm diameter particles of volcanic ash, dispersed uniformly in water. Honing polishing is carried out in a manner such that 10 to 100 µm diameter particles of volcanic ash are uniformly dispersed in water to form a slurry and the slurry is ejected under pressure through a nozzle, causing the particles to obliquely collide against the support surface to perform surface roughening. Alternatively, the support surface is laminated with a sheet that is coated with 10 to 100 µm diameter abrasive particles at intervals of 100 to 200 µm and a density of $2.5 \times 10^3 – 10 \times 10^3$ particles/cm$^2$ and the roughened pattern of the sheet is transferred under pressure onto the support surface to achieve roughening.

It is preferred that after completion of the mechanical surface roughening, the support is immersed in an aqueous acid or alkali solution to remove abrasive particles buried in the surface of the support or aluminum chips formed therein. Used may be acids such as sulfuric acid, persulfuric acid, hydrofluoric acid, phosphoric acid, nitric acid and hydrochloric acid, and bases such as sodium hydroxide and potassium hydroxide. Of the foregoing, an aqueous alkali solution, such as aqueous sodium hydroxide is preferably used. The dissolution amount of aluminum on the surface is preferably 0.5–5 g/m$^2$. It is also preferred that after immersion in an aqueous alkali solution, the support is further immersed in acid such as phosphoric acid, nitric acid, sulfuric acid or chromic acid or a mixture thereof to affect neutralization.

Electrochemical roughening is not specifically limited but electrochemically performing the surface roughening in an acidic electrolytic solution is preferred. Acidic electrolytic solutions that are usually used in the electrochemical surface roughening are usable, of which hydrochloric or nitric acid electrolytic solution is preferable. Electrochemical surface roughening can be performed in accordance with methods described, for example, in JP-B No. 48-28123, British Patent No. 896,563, and JP-A No. 53-67507. Applying a voltage within the range of 1–50 volts (preferably 10–30) usually carries out the surface roughening, and the voltage is more preferably in 10–30 volts. The electric current density is commonly within the range of 10–200 A/dm$^2$, but preferably 50–150. The electric quantity is within the range of 100–5,000 c/dm$^2$, but preferably 100–2,000. Surface roughening is usually carried out at a temperature of 10–50° C., but preferably 15–45.

Electrochemical surface roughening using a nitric acid type electrolytic solution is usually carried out by applying a voltage of 1–50 volts, and preferably 10–30. The electric current density is usually within the range of 10–200 A/dm$^2$, and preferably 20–100. The electric quantity is commonly within the range of 100–5,000 c/dm$^2$, and preferably 100–2,000. The surface roughening is usually carried out at a temperature of 10–50° C., and preferably 15–45. The nitric acid concentration of the electrolytic solution is preferably 0.1–5 weight %. The electrolytic solution may optionally have additives such as nitrates, chlorides, amines, aldehydes, phosphoric acid, chromic acid, boric acid, acetic acid or oxalic acid.

Electrochemical surface roughening using a hydrochloric acid type electrolytic solution is usually carried out by applying a voltage of 1–50 volts, and preferably 2–30 volts. The electric current density is usually within the range of 10–200 A/dm$^2$, and preferably 50–150 A/dm$^2$. The electric quantity is usually within the range of 100–5,000 c/dm$^2$, and preferably 100–2,000 c/dm$^2$. The surface roughening is commonly carried out at a temperature of 10–50° C., and preferably 15–45° C. The nitric acid concentration of the electrolytic solution is preferably 0.1–5 weight %.

It is preferred that after completion of the foregoing electrochemical surface roughening, the support is immersed in an aqueous acid or alkali solution to remove aluminum chips from the surface of the support. Used may be acids such as sulfuric acid, persulfuric acid, hydrofluoric acid, phosphoric acid, nitric acid and hydrochloric acid, and bases such as sodium hydroxide and potassium hydroxide. Of the foregoing, an aqueous alkali solution is preferably used. The dissolution amount of aluminum on the surface is preferably 0.5–5 g/m$^2$. It is also preferred that after being immersed in an aqueous alkali solution, the support is further immersed in acid such as phosphoric acid, nitric acid, sulfuric acid or chromic acid or a mixture thereof to perform neutralization.

The mechanical surface roughening and electrochemical surface roughening may be carried out separately. Alternatively, mechanical surface roughening is carried out, followed by electrochemical surface roughening.

Subsequent to the surface roughening treatment, an anodic oxidation treatment is carried out. Methods for the anodic oxidation usable in this invention are not specifically limited and most commonly known methods are applicable. The anodic oxidation results in formation of an oxide coat on the surface of the support. The anodic oxidation is carried out preferably using aqueous electrolytic solution containing sulfuric acid and/or phosphoric acid at a concentration of 10–50% and at a current density of 1–10 A/dm$^2$. Also disclosed are electrolysis in sulfuric acid at a relatively high current density, as described in U.S. Pat. No. 1,412,768; electrolysis using phosphoric acid, as described in U.S. Pat. No. 3,511,661; and the use of a solution containing chromic acid, oxalic acid or malonic acid alone or in combination. The coverage amount formed at anodic oxidation is preferably 1–50 mg/dm$^2$, and more preferably 10–40 mg/dm$^2$. The coverage amount formed during anodic oxidation is determined by measuring the weight change before and after dissolution of the formed layer on the plate, in such a manner as soaking the aluminum plate in a phosphoric acid-chromic acid solution (being prepared by dissolving 35 ml of 85% phosphoric acid and 20 g of chromium (IV) oxide into 1 L of water) which dissolves the oxidized film layer.

A support which has been subjected to the anodic oxidation treatment may optionally be subjected to a sealing treatment of an anodic oxide coat. Sealing of the anodic coat can be conducted by commonly known methods, including a hot water treatment, a boiling water treatment, a steam treatment, a sodium silicate treatment, an aqueous dichromate treatment, a nitrite treatment, or an ammonium acetate treatment.

The thus treated support may further be sub-coated with a water-soluble resin such as polyvinyl sulfonate, a polymer or copolymer having a side-chain containing a sulfonate group, polyacrylic acid, a water-soluble metal salt (e.g., zinc borate), a yellow dye or an amine salt. Also suitably used may be a sol-gel treated substrate, in which a functional group capable of causing radical addition reaction is covalently bonded, as described in JP-A No. 5-304358.

The prepared photosensitive composition (photosensitive layer coating composition) is coated onto a support using conventional methods and dried to obtain a photosensitive planographic printing plate material. Coating methods of the coating composition include, for example, an air-doctor coating method, a blade coating method, a wire-bar coating method, a knife coating method, a dip coating method, a reverse roll coating method, a gravure coating method, a cast coating method, a curtain coating method and an extrusion coating method.

Drying the photosensitive layer at a low temperature cannot achieve sufficient printing durability, and drying at excessively high temperature often results in not only the Marangoni phenomenon but also fogging in non-printing areas. The drying temperature is preferably 60–160° C., more preferably 80–140° C., and still more preferably 90–120° C.

Light sources for use in imaging exposure for the photosensitive planographic printing plate related to this invention include, for example, a laser, a light-emitting diode, a xenon lamp, a xenon flash lamp, a halogen lamp, a carbon arc lamp, a metal halide lamp, a tungsten lamp, a high-pressure mercury lamp, and electrodeless light sources.

When subjected to overall exposure, a masking material forming an intended exposure image in a negative pattern with a light-shielding material is superimposed on the photosensitive layer, after which exposure is conducted.

The use of an array type light source such as a light-emitting diode array or controlling exposure by an optical shuttering material such as a liquid crystal or PLZT using a halogen lamp, a metal halide lamp or a tungsten lamp, which renders it possible to perform digital exposure in response to image signals, is preferable. In that case, direct write-in is feasible without using masking materials.

Laser exposure, in which light can be reduced to a beam form, rendering it feasible to perform scanning exposure in response to image date, is suitable for direct write-in without using masking materials. Further, the use of a laser as a light source can easily narrow the exposure area to a microscopic, thereby achieving high-resolution image formation.

Suitable laser light sources include an argon laser, a He—Ne gas laser, a YAG laser and a semiconductor laser. Laser light sources having an oscillation wavelength within the visible region are preferred in this invention. Specific examples thereof include a harmonic YAG laser emitting at ca. 532 nm and an argon ion laser emitting at ca. 488 nm. Further, semiconductor lasers using an InGa type material or a ZnSe type material and capable of continuously emitting at 380–430 nm are also preferred in this invention.

Laser scanning exposure includes external drum scanning, internal drum scanning and planar scanning. External drum scanning means that recording material is wound around the external surface of the drum, laser exposure is conducted, while rotating the drum, in which the main scanning is in the direction of drum rotation and the sub-scanning is in the direction of laser light shift. In internal drum scanning, recording material is fixed onto the internal surface of the drum and exposed to a laser beam from inside the drum, in which the main-scanning is conducted by rotating a part or all of an optical system in the circumferential direction and the sub-scanning is conducted by shifting a part or all of an optical system in the direction parallel to the axis of the drum. In planar scanning, main-scanning exposure is conducted by combining a polygon mirror or galvano-mirror with an fθ lens and sub-scanning exposure is conducted by moving the recording medium. External drum scanning and internal drum scanning easily lead to enhancement in precision of the optical system, which is suitable for high-density recording.

When image exposed, exposed areas of the photosensitive layer are hardened. Development using an alkali developer solution removes unexposed areas, thereby forming images. Aqueous alkali solutions are commonly known as developing solutions. Examples thereof include alkali developing solutions containing inorganic alkali agents, such as sodium silicate, potassium silicate, and ammonium silicate; sodium di-hydrogen phosphate, potassium di-hydrogen phosphate, and ammonium di-hydrogen phosphate; sodium hydrogen carbonate, potassium hydrogen-carbonate, ammonium hydrogen carbonate; sodium borate, potassium borate, and ammonium borate; sodium hydroxide, potassium hydroxide, ammonium hydroxide and lithium hydroxide.

Also usable are organic alkali agents such as monomethylamine, dimethylamine, trimethylamine, monoethylamine, diethylamine, triethylamine, mono-i-propylamine, di-i-propylamine, tri-i-propylamine, butylamine, monoethanolamine, diethanolamine, triethanolamine, mono-i-propanolamine, di-i-propanolamine, ethyeleimine, ethylenediamine, and pyridine.

These alkali agents may be used alone or in combination. The developer solution may optionally be added with anionic surface active agents, amphoteric surface active agents and organic solvents such as alcohols.

Aqueous solutions related to this invention preferably exibit a pH of 8.5 to 12.5 at 1% by weight of a silicate concentration, represented by equivalent conversion to $SiO_2$. Also, the aqueous solution may contain other additives. An aqueous solution which further contains a surfactant of 0.1–5.0 weight % is more preferred.

EXAMPLES

The present invention will be further described with respect to specific examples of synthesis, preparation of a support and preparation of a photosensitive planographic printing plate, but embodiments of this invention are by no means limited to these described here. Unless otherwise noted, "part(s)" means part(s) by weight.

Example 1

Synthesis of Polymer Binder

Into a three-necked flask, 58.0 parts (0.58 mol) of methyl methacrylate, 35.0 parts (0.41 mol) of methacrylic acid, 6.0 parts (0.05 mol) of ethyl methacrylate, 100 parts of ethanol and 1.23 parts of α,α'-azobisisobutylonitrile were added and reacted in a stream of nitrogen gas in an oil bath at 80° C. for 6 hrs to obtain a macro molecule polymer. Thereafter, to the polymer, added were 1 part of triethylbenzylammonium chloride and 28.0 parts (0.2 mol) of glycidyl methacrylate (being an epoxy-containing unsaturated compound) and reacted at 25° C. for 3 hrs. to obtain Polymer Binder A. The weight average molecular weight, which was determined using a GPC, was ca. 70,000.

The monomer unit ratio and the ratio of the epoxy group containing unsaturated compounds to be reacted with a carboxyl group were changed in preparation quantity as shown in Table 1, and further the weight average molecular weights of them were changed by controlling reaction time of copolymerization, and conducting similar operations to obtain Polymer Binders B and C.

TABLE 1

|   | MMA | MAA | EMA | GMA | Acid Value | Mw |
|---|---|---|---|---|---|---|
| A | 58 | 35 | 6 | 28 | 95 | 70,000 |
| B | 69 | 25 | 6 | 0 | 140 | 69,000 |
| C | 69 | 25 | 6 | 14 | 95 | 68,000 |

Preparation of Support

As a degreasing treatment, a 0.3 mm thick aluminum plate (material No. 1050, H16) was immersed for 1 min. into an aqueous 5% sodium hydroxide solution maintained at 65° C., and then washed with water. To be neutralized, the degreased aluminum plate was dipped for 1 min. into an aqueous 10% sulfuric acid solution maintained at 25° C., and then washed. Subsequently, the aluminum plate was subjected to electrolytic surface roughening in an aqueous hydrochloric acid solution at a concentration of 11 g/L for 20 sec. using an alternating current under the condition of a current density of 50 A/dm² and a frequency of 50 Hz at 25° C., and washed with water, and was further subjected to a desmutting treatment for 10 sec. in an aqueous 1% sodium hydroxide solution maintained at 50° C., and again washed with water. The thus processed aluminum plate was subjected to a neutralization treatment for 30 sec. in an aqueous 30% sulfuric acid solution maintained at 50° C., and washed. Consequently, the thus desmutted, surface-roughened aluminum plate was subjected to an anodic oxidation treatment in an aqueous 20% sulfuric acid solution under the conditions of a current density of 5 A/dm², voltage of 15 V, and a frequency of 50 Hz at 25° C. for 40 sec., and washed. Further, the aluminum plate was subjected to a dipping treatment for 30 sec. in an aqueous 0.44% polyvinyl sulfonic acid solution ay 75° C., and washed with distilled water, and the dried with cold air blast of 25° C. to obtain a support for a photopolymerizable photosensitive planographic printing plate. The obtained support exhibited a center-line average roughness (Ra) of 0.65 µm.

Preparation of Planographic Printing Plate Material

Onto the above surface treated support, a photopolymerizable photosensitive layer coating composition having the following compositions was coated with a wire-bar coating method at 2.0 g/m² when dried, and then dried at 95° C. for 1.5 min. Subsequently, onto the photosensitive layer, an overcoat layer coating composition of the following compositions was coated with an applicator to 2.0 g/m² when dried, and then dried at 75° C. for 1.5 min. to obtain a planographic printing plate material having a overcoat layer of an oxygen shielding layer on a photosensitive layer.

Photopolymerizable Photosensitive Layer Coating Composition

| | |
|---|---|
| Polymer binder (Polymer Binder B) | 45.0 parts |
| Spectral sensitizing dye (Compounds shown in Table 2) | 2.0 parts |

Photopolymerization initiator
Compound and amount shown in Table 2
Acid generating agent
Compound and amount shown in Table 2
Addition-polymerizable, ethylenically double bond containing monomer
Tertiary amineurethane monomer (Compound A)
    Amount shown in Table 2
Multifunctional urethane acrylate (NK OLIGO U-4HA, produced by
    SHIN-NAKAMURA CHEMICAL CO., LTD.)
        Amount shown in Table 2
Multifunctional tertiary amine acrylate
    (EB 83, produced by Daicel-UCB)
        Amount shown in Table 2
Polyethylene glycol #200 dimethacrylate
    (NK ESTER 4G, produced by SHIN-NAKAMURA CHEMICAL CO. LTD.)
        Amount shown in Table 2

| | |
|---|---|
| Phthalocyanine pigment (MHI 454, 30% dispersion of MEK, produced by Mikuni Color Ltd.) | 6.0 parts |
| Hyndered amine light stabilizing agent (LS 770, produced by Sankyo CO., LTD.) | 0.5 parts |
| Fluorine surface active agent (F 178 K, produced by DAINIPPON INK AND CHEMICALS, INCORPORATED.) | 0.5 parts |
| Methyl ethyl ketone (having a boiling point of 79.6° C.) | 80 parts |
| Cyclohexane (having a boiling point of 155° C.) | 820 parts |

Overcoat Layer (Protective Layer, Namely an Oxygen Shielding Layer) Coating Composition

| | |
|---|---|
| Polyvinyl alcohol (GL-03, produced by THE NIPPON SYNTHETIC CHEMICAL INDUSTRY CO., LTD.) | 89 parts |
| Water-soluble polyamide (P-70, produced by Toray Industries, Inc.) | 10 parts |
| Surface active agent (Surfinol 465, produced by NISSIN KAGAKU KENKYUSHO CO., LTD.) | 0.5 parts |
| Water | 900 parts |

Image Formation

The thus prepared photosensitive planographic printing plate samples were each exposed at 2,400 dpi of resolution using a CTP exposure apparatus loaded with a FD-YAG laser light source (TigerCat, manufactured by ECRM Co.). Hereinafter, the term "dpi" used in this invention represents the number of dots per inch or 2.54 cm. Subsequently, development processing was conducted using a CTP automatic processor (PHW 32-V, manufactured by Technigraph Co.), which was provided with a pre-heat section to heat the photosensitive planographic printing plate, a pre-washing section to remove the oxygen gas shielding layer, a developing section filled with Developer Solution Composition 1 described below, a washing section to remove Developer Solution Composition 1 adhered to the plate surface and a processing section of a gum solution to protect line-image areas (GW-3, produced by Mitsubishi Chemical Corp., double-diluted solution), and then planographic printing plates of Sample Nos. 1–10 of this invention and Sample Nos. 11–15 of the comparatives were prepared. In this case, the heating section was set up for 115° C. of the plate surface temperature and for 15 sec. of the plate heating time. The plate was inserted into the heating section of an automatic processor within 60 sec. after exposure. Developing Solution Composition 1 (being an aqueous solution containing the following additives)

| | |
|---|---|
| Potassium silicate A | 8.0 weight % |
| PELEX NB-L (produced by Kao Corp.) | 3.0 weight % |
| Caustic potash | to maintain the pH at 12.3 |

Evaluation of Planographic Printing Plate

The thus obtained planopgraphic printing plates were evaluated as follows. The obtained results are shown in Table 3.

Sensitivity

Changing the exposure energy employing a laser, a 100% solid image density was measured at every exposure energy level. It was determined that the sensitivity point was 10% lower density than the maximum solid image density (being equivalent to the minimum image forming energy).

Storage Stability

The photopolymerizable photosensitive planographic printing plates were stored in a thermostatically controlled chamber at 55° C. and 20% RH for 5 days for forced aging. The residue after processing was compared before and after aging.

Printing Durability

Printing was conducted using the planographic printing plate which was prepared by exposure of 175 line images with the appropriate exposure and processed, employing a printer (DAIYA 1F-1, manufactured by Mitsubishi Industries, Ltd.) using coat paper, printing ink (Toyoking High Echo M ponceau, produced by TOYO INK MFG. CO., LTD.) and dampening water (H Solution SG-51, concentration of 1.5%, produced by TOYO INK MFG. CO., LTD.). The number of printed sheets of which a 3% dot loss in highlighted portions or filling up in shadow areas occurred, was the measure of printing durability.

Safelight Safety Characteristics

A white fluorescent light tube double wrapped with a filter of Leefilter 106 PRIMARY RED was employed as a safelight. The time to result in a poor developing was measured every minute under the conditions of 17 Lux measured by an illumination photometer.

TABLE 2

| Sample | Spectral Sensitizing Dye | Photopolymerization Initiator Kind | Amount (weight part) | Acid Generating Agent Kind | Amount (weight part) | Tertiary amineurethane monomer compound A | NK OLIGO U-4HA | EB 83 | NK Ester 4G | Remarks |
|---|---|---|---|---|---|---|---|---|---|---|
| 1 | Ethyleosin | Iron arene compound 1 | 3 | PV30 | 2.5 | 30 | — | — | 15 | Inv. |
| 2 | Ethyleosin | Iron arene compound 1 | 3 | PV30: dihalo | 2.5 | 30 | — | — | 15 | Inv. |
| 3 | Ethyleosin | Iron arene compound 2 | 3 | PV30 | 2.5 | 30 | — | — | 15 | Inv. |
| 4 | Ethyleosin | Iron arene compound 3 | 3 | PV30 | 2.5 | 30 | — | — | 15 | Inv. |
| 5 | Ethyleosin | Iron arene compound 2 | 3 | 4-4 | 2.5 | 30 | — | — | 15 | Inv. |
| 6 | Ethyleosin | Iron arene compound 2 | 3 | 4-8 | 2.5 | 30 | — | — | 15 | Inv. |
| 7 | Ethyleosin | Iron arene compound 2 | 3 | Trichloro | 3 | 30 | — | — | 15 | Inv. |
| 8 | Ethyleosin | Iron arene compound 2 | 3 | *A | 2 | 30 | — | — | 15 | Inv. |
| 9 | Dye I | Iron arene compound 2 | 3 | *A | 2 | 30 | — | — | 15 | Inv. |
| 10 | Ethyleosin | Iron arene compound 2 | 3 | *B | 2 | 30 | — | — | 15 | Inv. |
| 11 | Ethyleosin | Iron arene compound 2 | 3 | *B | 2 | — | — | 30 | 15 | Inv. |
| 12 | AO503 | CGI-784 | 4 | PV30 | 2.5 | — | 30 | — | 15 | Comp. |
| 13 | AO503 | CGI-784 | 4 | PV30 | 2.5 | — | — | 30 | 15 | Comp. |
| 14 | Ethyleosin | CGI-784 | 4 | PV30 | 2.5 | 30 | — | — | 15 | Comp. |
| 15 | AO503 | CGI-784 | 4 | PV30 | 2.5 | 30 | — | — | 15 | Comp. |
| 16 | AO503 | CGI-784 | 4 | *B | 2 | 30 | — | — | 15 | Comp. |

*A; trichloroacetamide
*B; tribromoacetylamide
Inv.; This invention
Comp.; Comparative example

TABLE 3

| Sample | Sensitivity (μj/cm²) | Printing durability | Storage stability | Safelight | Remarks |
|---|---|---|---|---|---|
| 1 | 40 | 100,000 | Good | More than 60 min. | Inv. |
| 2 | 45 | 80,000 | Good | More than 60 min. | Inv. |
| 3 | 40 | 100,000 | Good | More than 60 min. | Inv. |
| 4 | 35 | 100,000 | Good | 45 min | Inv. |
| 5 | 45 | 80,000 | Good | More than 60 min. | Inv. |
| 6 | 40 | 100,000 | Good | More than 60 min. | Inv. |
| 7 | 35 | 130,000 | Good | More than 60 min. | Inv. |
| 8 | 30 | 150,000 | Good | More than 60 min. | Inv. |
| 9 | 45 | 100,000 | Good | More than 60 min. | Inv. |
| 10 | 35 | 150,000 | Good | More than 60 min. | Inv. |
| 11 | 40 | 100,000 | Good | More than 60 min. | Inv. |
| 12 | 160 | 3,000 | Good | 10 min. | Comp. |
| 13 | 100 | 20,000 | Good | 6 min. | Comp. |
| 14 | 200 | 3,000 | Good | 10 min. | Comp. |
| 15 | 40 | 100,000 | Stains after 7 days | 5 min. | Comp. |
| 16 | 30 | 150,000 | Stains after 7 days | 3 min. | Comp. |

Inv.; This invention
Comp.; Comparative example

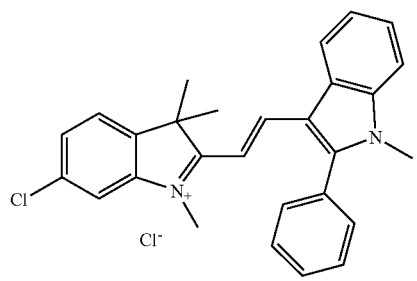
AO503
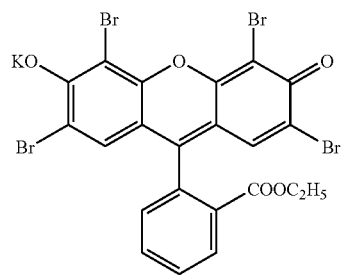
Ethyl eosin
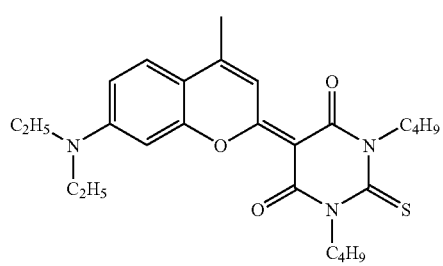
Dye I
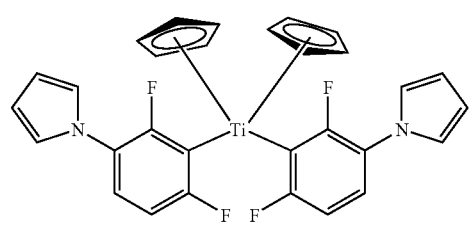
CGI-784
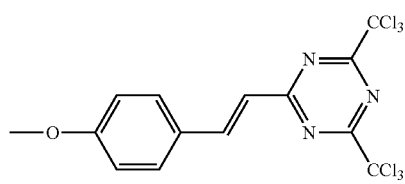
PV30
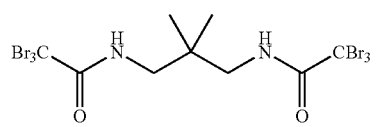
Tribromoacetylamide
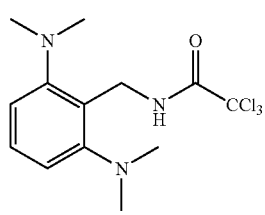
Trichloroacetamide
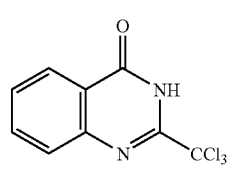
Trichloro -continued

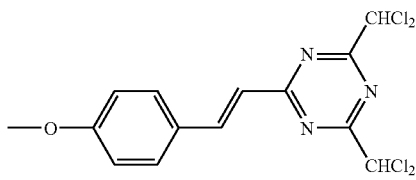

PV30:dihalo

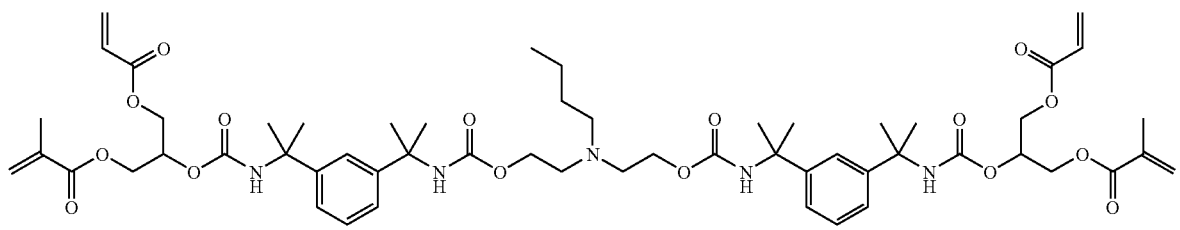

Tertiary amine urethane monomer compound A

Iron Arene 1

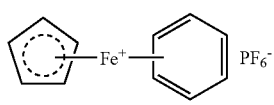

Iron Arene 2

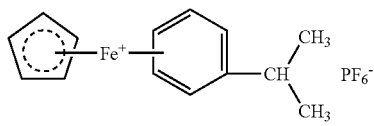

Iron Arene 3

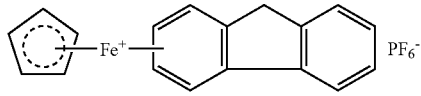

Based on the present invention, it was proved that stains after processing were reduced, and safelight safety characteristics was significantly improved. Further, there were no exhibited problems in sensitivity and printing durability.

Example 2

Preparation of the support and the surface treatment were conducted in a manner similar to Example 1. Binders were selected from those prepared above.

Preparation of Planographic Printing Plate Material

Onto the above support, a planographic printing plate material having an overcoat layer on a photosensitive layer was prepared in the same manner as in Example 1, except that the photopolymerizable photosensitive layer coating composition was replaced with one having the following composition.

Photopolymerizable Photosensitive Layer Coating Composition

| | |
|---|---|
| Polymer binder | Kind and amount shown in Table 4 |
| Spectral sensitizing dye (ethyl eosin) | 2.0 parts |
| Photopolymerization Initiator (iron arene 2) | 3.0 parts |

Acid generating agent
Compound and amount shown in Table 4
Addition-polymerizable, ethylenically double bond containing monomer

| | |
|---|---|
| Tertiary amineurethane monomer (Compound B) | 30.0 parts |
| Polyethylene glycol #200 dimethacrylate (NK ESTER 4G, produced by SHIN-NAKAMURA CHEMICAL CO. LTD.) | 15.0 parts |
| Phthalocyanine pigment (MHI 454, 30% dispersion of MEK, produced by Mikuni Color Ltd.) | 6.0 parts |
| Hindered amine light stabilizing agent (LS 770, produced by Sankyo CO., LTD.) | 0.5 parts |
| Fluorine surface active agent (F 178 K, produced by DAINIPPON INK AND CHEMICALS, INCORPORATED.) | 0.5 parts |
| Methyl ethyl ketone (having a boiling point of 79.6° C.) | 80 parts |
| Cyclohexane (having a boiling point of 155° C.) | 820 parts |

Overcoat Layer (Protective Layer) Coating Composition

| | |
|---|---|
| Polyvinyl alcohol (GL-03, produced by THE NIPPON SYNTHETIC CHEMICAL INDUSTRY CO., LTD.) | 100 parts |
| Surface active agent (F 1405, produced by DAINIPPON INK AND CHEMICALS, INCORPORATED) | 0.5 parts |
| Water | 900 parts |

With an operation similar to Example 1, images were formed, and evaluation of Planographic Printing Plate Samples 16–24 was conducted. The results of which are shown in Table 4.

TABLE 4

Tertiary amineurethane monomer compound B

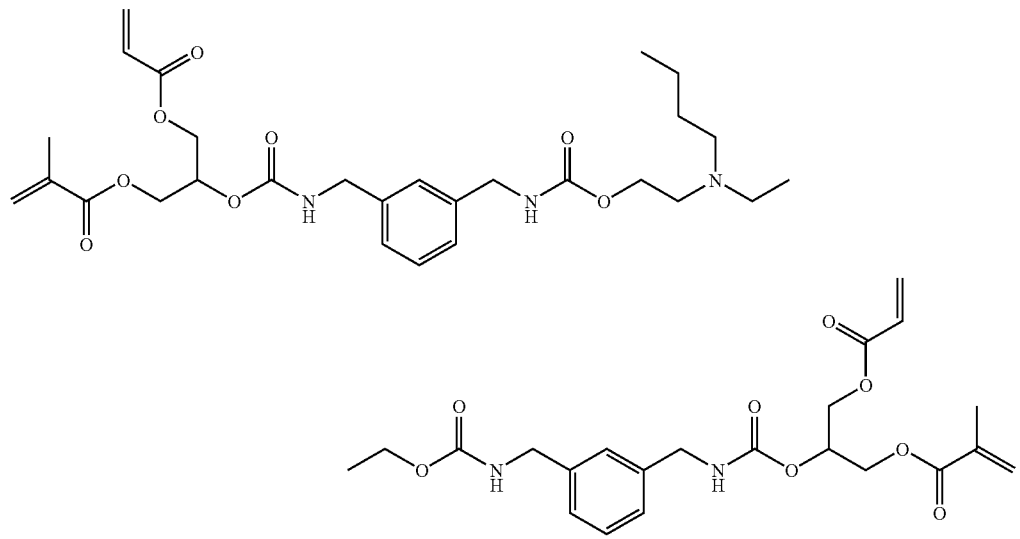

| Sample | Binder Kind | Binder Amount | Acid generating agent Kind | Acid generating agent Amount | Sensitivity ($\mu j/cm^2$) | Printing durability | Storage stability | Safelight | Remarks |
|---|---|---|---|---|---|---|---|---|---|
| 16 | A | 50 | PV30 | 2.5 | 40 | 300,000 | Good | More than 60 min. | Inv. |
| 17 | B | 50 | PV30 | 2.5 | 40 | 120,000 | Good | More than 60 min. | Inv. |
| 18 | C | 50 | PV30 | 2.5 | 40 | 250,000 | Good | More than 60 min. | Inv. |
| 19 | A | 50 | Trichloroacetylamide | 2.2 | 24 | 400,000 | Good | More than 60 min. | Inv. |
| 20 | B | 50 | Trichloroacetylamide | 2.2 | 25 | 120,000 | Good | More than 60 min. | Inv. |
| 21 | C | 50 | Trichloroacetylamide | 2.2 | 25 | 300,000 | Good | More than 60 min. | Inv. |
| 22 | A | 50 | None | 0 | 160 | 15,000 | Good | More than 60 min. | Comp. |
| 23 | B | 50 | None | 0 | 210 | 10,000 | Good | More than 60 min. | Comp. |
| 24 | C | 50 | None | 0 | 180 | 8,000 | Good | More than 60 min. | Comp. |

Inv.; This invention
Comp.; Comparative example

Based on the present invention, it was proved that storage stability and safelight safety characteristics, and also sensitivity and printing durability, could be compatible at very high level, and the planographic printing plates of the invention are desirable from a practical standpoint.

Example 3

The coating composition of the planographic printing plate used for Sample 19 of Example 2 was coated onto each of the supports described in Table 5 in the same manner as Sample 19. The overcoat layer, also used for Sample 19, was coated onto each sample, and thus Samples 25–32 were prepared.

Long Term Storage Stability

The planographic printing plate materials were maintained in a thermostatically controlled chamber at 55° C. and 20% RH for 3, 5 and 7 days for forced aging. Long Term Storage Stability was evaluated from the above evaluation of sensitivity and printing stains, comparing with those of samples before forced aging.

Evaluation of Staining
A: no staining
B: stains were observed but no problem in practical use
C: too much staining and practically unacceptable

TABLE 5

| Sample | Support Ra μm | Treatment for hydrophilicity | Sensitivity μj/cm² | Developability | Storage stability 3 days μj/cm² | 5 days μj/cm² | 7 days μj/cm² | Stain 3 days | 5 days | 7 days | Printing durability | Remarks |
|---|---|---|---|---|---|---|---|---|---|---|---|---|
| 25 | 0.15 | PVPA | 60 | Good | 60 | 60 | 100 | A | A | A | 200,000 sheets | Inv. |
| 26 | 0.25 | PVPA | 40 | Good | 40 | 40 | 40 | A | A | A | 350,000 sheets | Inv. |
| 27 | 0.5 | PVPA | 30 | Good | 30 | 30 | 30 | A | A | A | 400,000 sheets | Inv. |
| 28 | 0.65 | PVPA | 24 | Good | 24 | 24 | 24 | A | A | A | 400,000 sheets | Inv. |
| 29 | 0.95 | PVPA | 24 | Good | 24 | 20 | 18 | A | C | C | 400,000 sheets | Inv. |
| 30 | 0.65 | — | 24 | Good | 24 | 24 | 20 | A | A | B | 400,000 sheets | Inv. |
| 31 | 0.65 | Si | 50 | Good | 50 | 50 | 50 | A | A | A | 200,000 sheets | Inv. |
| 32 | 0.65 | Phosphoric acid | 80 | Good | 80 | 80 | 80 | A | A | C | 200,000 sheets | Inv. |

Inv.: This invention

Based on the present invention, it was proven that sensitivity and printing durability of the plate are good, and specifically, desirable embodiments of performance are confirmed by changing Ra of grain on the plate and treatment for phydrophilicity.

Ra was preferably 0.2–0.7, and specifically preferably 0.5–0.7 μm. As a treatment for hydrophilicity, it was proven that PVPA (polyvinyl phosphonic acid) treatment was preferable. Further, it was not described on the table, but safelight safety characteristics of all samples were good.

Example 4

The planographic printing plate materials used for Sample 9 and Comparative Sample 15 of Example 1 in this invention were prepared in large quantity, and running processed with each of the developing solution described in Table 6. The amount of sludge of each developing solution was measured after filtration. The planographic printing plate of Sample 33 was the planographic printing plate material used for Sample 15. The planographic printing plates of Samples 34–38 were the planographic printing plate material used for Sample 9.

Developing Solution Compositions (Aqueous Solution Containing the Following Additives)

| | |
|---|---|
| Potassium silicate A | 8.0 weight % |
| Surface active agent shown in Table 6 | 3.0 weight % |
| Caustic potash | amount to bring pH to 12.3 |

Sludge

Preparing 1.5 m² of each samples, pre-heating and pre-washing were conducted using the foregoing automatic processor, after which the overcoat layer was removed, and then the sample was soaked in 100 ml of the foregoing developing solution at 28° C. for 30 sec. The total of 1.5 m² was processed without replenishment. The developing solution was filtered and the residual sludge was washed and dried at 70° C. for 1 day. Further, the developing solution was stored in a thermostatic chamber at 55° C. and 20% RH for 7 days to evaluate storage stability and staining. The evaluation criteria were the same as those of Example 3, and the results are shown in Table 6.

TABLE 6

| | Amount of sludge (g) Developing solution | | | Sensitivity μj/cm² Developing solution | | | Storage stability μj/cm² Developing solution | | | Stain Developing solution | | | |
|---|---|---|---|---|---|---|---|---|---|---|---|---|---|
| Sample | PELEX | Surface active agent 1 | Surface active agent 2 | PELEX | Surface active agent 1 | Surface active agent 2 | PELEX | Surface active agent 1 | Surface active agent 2 | PELEX | Surface active agent 1 | Surface active agent 2 | Remarks |
| 33 | 0.9 | 0.3 | 0.3 | 30 | 40 | 40 | Stain | Stain | Stain | C | B | B | Comp. |
| 34 | 0.2 | 0.1 | 0.1 | 35 | 35 | 40 | 33 | 35 | 35 | A | A | A | Inv. |
| 35 | 0.2 | 0.1 | 0.1 | 24 | 25 | 24 | Stain | 24 | 25 | C | A | A | Inv. |
| 36 | 0.3 | 0.15 | 0.1 | 24 | 25 | 24 | Stain | 25 | 24 | B | A | A | Inv. |
| 37 | 0.2 | 0.1 | 0.1 | 50 | 55 | 55 | 50 | 55 | 55 | A | A | A | Inv. |
| 38 | 0.3 | 0.15 | 0.1 | 80 | 90 | 100 | Stain | 90 | 100 | C | A | A | Inv. |

Comp.; Comparative example
Inv.; This invention

Surface Active Agent 1

[Structure: naphthalene-O(CH₂CH₂O)₁₀H]

Surface Active Agent 2

[Structure: naphthalene-O(CH₂CH₂O)₁₀SO₃Na]

Although it is not shown in Table 6, safelight safety characteristics and printing durability were also good when using the different developing solution. It was proved that the samples of the present invention were superior not only in sensitivity, printing durability and safelight safety characteristics, but also in reduced sludge, compared to the conventional technology. Further, it was proved that the above effects were strongly exhibited by combination with a desirable developing solution.

Example 5

Samples 39–41 were prepared in the same manner as Sample 27 of Example 1, except that the spectral sensitizing dye added to the planographic printing plate material of Sample 27 was replaced with the compounds described in Table 7 in the amounts of Table 7. The overcoat layer was also the same as that of Sample 27.

The planographic printing plates of Sample 39–41 were exposed by using a plate setter ((TigerCat, manufactured by ECRM Imaging Systems) provided a laser light source with energy output of 30 mV at 408 nm. It was confirmed that all samples formed good images.

TABLE 7

| Sample | Dye Kind | Amount | Remarks |
|---|---|---|---|
| 39 | ST 190 | 2 | This invention |
| 40 | Coumarin 481 | 2 | This invention |
| 41 | Coumarin 515 | 2 | This invention |

ST 190

[Structure of ST 190]

Coumarin 481

[Structure of Coumarin 481 with CF₃ and (C₂H₅)₂N groups]

TABLE 7-continued

| Sample | Dye Kind | Amount | Remarks |
|---|---|---|---|

Coumarin 515

[Structure of Coumarin 515 with (C₂H₅)₂N group]

EFFECTS OF THE PRESENT INVENTION

According to the present invention, it is possible to provide a photosensitive composition which exhibits high sensitivity and high printing durability depending on laser exposure, and also highly improved safelight safety characteristics, margin of safety and reduced cost, and provides a planographic printing plate using the above and its processing method.

What is claimed is:

1. A photosensitive composition comprising:
   (a) a polymerizable compound having an ethylenically unsaturated group;
   (b) a metallic arene compound; and
   (c) an acid generating agent,
   wherein, the polymerizable compound is a multifunctional acrylate compound containing an amide bond and a secondary or tertiary amine group in the molecule,
   the acid generating agent is a compound containing a trihalomethyl group, dihalomethyl group or dihalomethylene group, and
   the metallic arene compound is represented by Formula (5):

Formula (5)

[Structure showing cyclopentadienyl-M-X¹ with Y¹]

wherein $X^1$ is a group containing at least one benzene ring; $Y^1$ is a basic ionic compound; and M is a metal.

2. The photosensitive composition according to claim 1, wherein the acid generating agent is a compound represented by Formulas (1) or (2):

$$CR^2_xH_{3-x}—(C═O)—R^1 \quad \text{Formula (1)}$$

wherein x is an integer of 2 or 3, $R^1$ is an aryl group, an acyl group or an organic group having a heterocyclic group, and $R^2$ is a chlorine atom or a bromine atom, $$CR^2_xH_{3-x}—R^3 \quad \text{Formula (2)}$$

wherein x is an integer of 2 or 3, $R^3$ is an aryl group, an acyl group or an organic heterocyclic group other than a triazine group, and $R^2$ is a chlorine atom or a bromine atom.

3. The photosensitive composition according to claim 2, wherein the acid generating agent contains an oxadiazole group.

4. The photosensitive composition according to claim 2, wherein the acid generating agent is a compound represented by Formulas (3) or (4), $$R^4—C(Y)_2—(C=O)—R^5 \quad \text{Formula (3)}$$

wherein $R^4$ is a hydrogen atom, a halogen atom, an alkyl group, an aryl group, an acyl group, an alkylsulfonyl group, an arylsulfonyl group or a cyano group, $R^5$ is an monovalent substituent group, provided that $R^4$ and $R^5$ may combine to form a ring, and Y is a halogen atom, $$C(Y)_3—(C=O)—X—R^6 \quad \text{Formula (4)}$$

wherein $R^6$ is a monovalent substituent group, X is O or —$NR^7$—, $R^7$ is a hydrogen atom or an alkyl, group, provided that $R^6$ and $R^7$ may combine to form a ring, and Y is a halogen atom.

5. The photosensitive composition according to claim 1, wherein the acid generating agent contains an oxadiazole group.

6. The photosensitive composition according to claim 1, wherein the acid generating agent is a compound represented by Formulas (3) or (4):

$$R^4—C(Y)_2—(C=O)—R^5 \quad \text{Formula (3)}$$

wherein $R^4$ is a hydrogen atom, a halogen atom, an alkyl group, an aryl group, an acyl group, an alkylsulfonyl group, an arylsulfonyl group or a cyano group, $R^5$ is an monovalent substituent group, provided that $R^4$ and $R^5$ may combine to form a ring, and Y is a halogen atom, $$C(Y)_3—(C=O)—X—R^6 \quad \text{Formula (4)}$$

wherein $R^6$ is a monovalent substituent group, X is O or —$NR^7$—, $R^7$ is a hydrogen atom or an alkyl group, provided that $R^6$ and $R^7$ may combine to form a ring, and Y is a halogen atom.

7. The photosensitive composition according to claim 1, wherein the halogen atom of the acid generating agent is a chlorine atom or a bromine atom.

8. The photosensitive composition according to claim 1, wherein 10 to 90 weight % of the polymerizable compound has a weight average molecular weight of 15,000 to 500,000 and an acid value of 30 to 200 mg/KOH.

9. The photo polymerizable compound according to claim 8, wherein a ratio of units having a reactive group is 5 to 50 mol % based on the total mole of the polymerizable compound.

10. The photosensitive composition according to claim 1, wherein the photosensitive composition further contains at least one dye selected from the group consisting of a coumarin, ketocoumarin, oxonol, barbituric acid, pyrromethane borate, diphenylmethane, xanthene dye, coumarin derivatives, and thiobarbituric acid skeleton.

11. A planographic printing plate comprising a support having thereon the following layers in the order:

(a) a layer containing the photosensitive composition described in claim 1; and (b) an oxygen shielding layer;

wherein the support is a metallic support and a surface of the support is electrically roughened in an acid medium, and then subjected to an anodization treatment to provide a surface Ra of 0.2 to 0.7 µm.

12. The planographic printing plate according to claim 11, wherein the surface Ra of the support is 0.5 to 0.7 µm.

13. The planographic printing plate according to claim 12, wherein the surface of the support is further treated with polyvinylphosphonic acid to provide hydrophilicity.

14. A method for processing the planographic printing plate described in claim 11 comprising the steps of:

(a) exposing the planographic printing plate to a laser; and (b) forming an image with an alkaline development processing, wherein the processing is conducted with a developing solution of pH of 10.0 to 12.5.

15. The processing method according to claim 14, wherein the alkaline developing solution contains an inorganic alkaline agent and a nonionic surface active agent having a polyoxyalkylene ether group, and a specific electric conductivity of the alkaline developing solution is 3 to 30 mS/cm.

16. The processing method according to claim 14, wherein the alkaline developing solution contains an inorganic alkaline agent and an anionic surface active agent having a polyoxyalkylene ether group, and a specific electric conductivity of the alkaline developing solution is 3 to 30 mS/cm.

* * * * *